US009049513B2

(12) United States Patent
Yamkovoy

(10) Patent No.: US 9,049,513 B2
(45) Date of Patent: Jun. 2, 2015

(54) HEADSET POWER SOURCE MANAGING

(71) Applicant: Paul G. Yamkovoy, Acton, MA (US)

(72) Inventor: Paul G. Yamkovoy, Acton, MA (US)

(73) Assignee: Bose Corporation, Framingham, MA (US)

( * ) Notice: Subject to any disclaimer, the term of this patent is extended or adjusted under 35 U.S.C. 154(b) by 423 days.

(21) Appl. No.: 13/622,165

(22) Filed: Sep. 18, 2012

(65) Prior Publication Data

US 2014/0079236 A1 Mar. 20, 2014

(51) Int. Cl.

| | |
|---|---|
| ***H04R 1/10*** | (2006.01) |
| ***G10K 11/16*** | (2006.01) |
| ***H03B 29/00*** | (2006.01) |
| ***H02B 1/00*** | (2006.01) |

(52) U.S. Cl.

CPC ............ *H04R 1/1025* (2013.01); *H04R 1/1041* (2013.01); *H04R 1/1083* (2013.01); *H04R 2410/05* (2013.01); *H04R 2460/03* (2013.01)

(58) Field of Classification Search

None

See application file for complete search history.

(56) References Cited

U.S. PATENT DOCUMENTS 2,797,315 A 6/1957 Holst
4,455,675 A 6/1984 Bose et al.
4,494,074 A 1/1985 Bose
4,593,696 A 6/1986 Hochmair et al.
4,899,388 A 2/1990 Mlodzikowski et al.
4,941,187 A 7/1990 Slater
5,001,763 A 3/1991 Moseley
5,105,377 A 4/1992 Ziegler, Jr.
5,212,811 A 5/1993 Kuge et al.
5,276,740 A 1/1994 Inanaga et al.
5,353,347 A 10/1994 Irissou et al.
5,396,551 A 3/1995 Lucey
5,402,497 A 3/1995 Nishimoto et al.
5,481,615 A 1/1996 Eatwell et al.
5,557,653 A 9/1996 Paterson et al.
5,604,813 A 2/1997 Evans et al.
5,649,307 A 7/1997 Patino
5,699,436 A 12/1997 Claybaugh et al.
5,768,473 A 6/1998 Eatwell et al.
5,815,582 A 9/1998 Claybaugh et al.
5,825,897 A 10/1998 Andrea et al.
6,108,426 A 8/2000 Stortz
6,118,878 A 9/2000 Jones
6,278,786 B1 8/2001 McIntosh
6,704,428 B1 3/2004 Wurtz
6,801,629 B2 10/2004 Brimhall et al.
6,952,481 B2 10/2005 Larsen et al.
7,024,230 B2 4/2006 Curtiss et al.

(Continued)

FOREIGN PATENT DOCUMENTS

EP 0548836 A1 6/1993
EP 0583900 2/1994

(Continued)

OTHER PUBLICATIONS

International Preliminary Report on Patentability dated Sep. 15, 2008 for PCT/US07/067496.

(Continued)

*Primary Examiner* — Regina N Holder

(57) ABSTRACT

A power management system and method for a noise reducing headset. The power management system adjusts the operations of the noise reducing headset based on the characteristics of the power sources available to the noise reducing headset.

15 Claims, 19 Drawing Sheets

(56) References Cited

U.S. PATENT DOCUMENTS

| | | | |
|---|---|---|---|
| 7,110,800 B2 | 9/2006 | Nagayasu et al. | |
| 7,215,766 B2 | 5/2007 | Wurtz | |
| 7,327,850 B2 | 2/2008 | Crump et al. | |
| 7,418,103 B2 | 8/2008 | Sargaison | |
| 7,590,254 B2 | 9/2009 | Olsen | |
| 7,668,308 B1 | 2/2010 | Wurtz | |
| 7,769,187 B1 | 8/2010 | Farrar et al. | |
| 7,945,297 B2 | 5/2011 | Philipp | |
| 7,983,427 B2 | 7/2011 | Yamkovoy et al. | |
| 8,189,803 B2 | 5/2012 | Bergeron et al. | |
| 8,222,641 B2 | 7/2012 | Yamkovoy et al. | |
| 8,494,184 B2 | 7/2013 | Yamkovoy | |
| 8,494,185 B2 | 7/2013 | Yamkovoy | |
| 2001/0046304 A1 | 11/2001 | Rast | |
| 2001/0050993 A1 | 12/2001 | Douglas | |
| 2002/0141599 A1 | 10/2002 | Trajkovic et al. | |
| 2003/0118197 A1 | 6/2003 | Nagayasu et al. | |
| 2005/0213774 A1 | 9/2005 | Kleinschmidt et al. | |
| 2005/0276421 A1 | 12/2005 | Bergeron et al. | |
| 2006/0153394 A1 | 7/2006 | Beasley | |
| 2007/0025561 A1 | 2/2007 | Gauger et al. | |
| 2007/0038442 A1 | 2/2007 | Visser et al. | |
| 2007/0121959 A1 | 5/2007 | Philipp | |
| 2007/0253569 A1 | 11/2007 | Bose | |
| 2008/0057857 A1 | 3/2008 | Smith | |
| 2008/0107287 A1 | 5/2008 | Beard | |
| 2009/0034748 A1 | 2/2009 | Sibbald | |
| 2009/0046868 A1 | 2/2009 | Engle et al. | |
| 2010/0278348 A1 | 11/2010 | Yamkovoy et al. | |
| 2011/0268291 A1 | 11/2011 | Ha | |
| 2012/0014529 A1 | 1/2012 | Yamkovoy | |
| 2012/0014530 A1 | 1/2012 | Yamkovoy | |
| 2012/0014531 A1 | 1/2012 | Yamkovoy | |
| 2012/0212063 A1* | 8/2012 | Terlizzi | 307/80 |

FOREIGN PATENT DOCUMENTS

| | | | |
|---|---|---|---|
| EP | 0643881 | | 3/1995 |
| EP | 935236 | A | 8/1999 |
| EP | 0993229 | | 4/2000 |
| EP | 1608202 | A2 | 12/2005 |
| EP | 2384022 | A2 | 11/2011 |
| GB | 2431313 | | 4/2007 |
| GB | 2433612 | A | 6/2007 |
| JP | 06-070391 | A | 3/1994 |
| JP | H8-70493 | | 3/1996 |
| JP | 08-307986 | A | 11/1996 |
| JP | 2001268684 | A | 9/2001 |
| JP | 2006-14307 | A | 8/2007 |
| JP | 2008219713 | A | 9/2008 |
| WO | 93/25167 | | 12/1993 |
| WO | 9325167 | A1 | 12/1993 |
| WO | 9326085 | A1 | 12/1993 |
| WO | 9802016 | A2 | 1/1998 |
| WO | 9904597 | A2 | 1/1999 |
| WO | 9957937 | A1 | 11/1999 |
| WO | 2004064443 | | 7/2004 |
| WO | 2007016020 | | 2/2007 |
| WO | 2012012331 | A1 | 1/2012 |

OTHER PUBLICATIONS

Chinese Office Action dated Mar. 13, 2009 in related CN Appl. No. 200510077928.0.

EP Search Report dated Aug. 7, 2006 from EP Appl. No. 05104712.4.

International Search Report and Written Opinion dated Apr. 25, 2008 from PCT/2007/067496.

EP Examination dated Feb. 9, 2010 for EP 05104712.4-1224.

CN Office Action dated Feb. 12, 2010 for CN Appl. No. 200510077928.0.

CN Office Action dated Sep. 3, 2010 for CN 200780014891.4.

JP OA dated Nov. 2, 2010 for JP2005-174271.

CN Office action dated Jan. 20, 2011 for CN Appln. No. 200510077928.0.

CN Office Action dated May 25, 2011 for CN Appln. 200510077928.0.

International Search Report and Writen Opinion dated Nov. 13, 2008, issued in International Application No. PCT/US2008/053698, filed Feb. 12, 2008.

International Preliminary Report on Patentability dated Aug. 27, 2009 for PCT/US2008/053698.

International Search Report and Written Opinion dated Apr. 22, 2014 for International application No. PCT/US2013/060107.

Japanese Unexamined Patent Application, Publication No. H8-70493, Publication date: Mar. 12, 1996.

Invitation to Pay Additional Fees dated Mar. 13, 2014 for International Application No. PCT/US2013/060107.

International Search Report and Written Opinion dated Jan. 22, 2013 issued in International Application No. PCT/US2012/065751, filed Nov. 19, 2012.

* cited by examiner

No External Power, Internal Battery Off or Depleted

Internal Battery Charged and On, No External Power

"Limited" External Power Available

"Unimited" External Power Available, No Mic Type Indication

HEADSET POWER SOURCE MANAGING

BACKGROUND

This specification describes a power management system for a noise reduction headset. The power management system is particularly relevant for military headsets. Military headsets are designed to serve a number of purposes. They provide noise attenuation in noisy environments. The noise attenuation typically includes passive attenuation, in which noise is attenuated prior to entering the ear canal, and may include active noise attenuation, in which an acoustic driver in the headset radiates sound waves that reduce noise. Military headsets also serve as communications headsets for electronically communicated messages that are transmitted wirelessly or by physical cables that are plugged into communications devices such as intercomm systems and portable radios. And additionally, military headsets may provide "talk through" capability, so that the user can hear acoustically transmitted communications, for example a nearby person speaking. Active noise attenuation, reproduction of electronically communicated audio signals, and talk through functions may require electrical power for amplification and signal processing. The power may come from at least two sources. One power source may be a battery that is included in or attached to the headset. A second power source may be a device to which the military headset may be detachably coupled. Devices to which the military headset may be detachably coupled include devices that are powered by storage batteries, devices that are powered by batteries that are charged by an electromechanical transducer for example a generator that is driven by the vehicle engine.

SUMMARY

In one aspect, a method for operating a noise reducing headset includes determining if electrical power from an external battery with an attached charging source is available, and if electrical power from the external battery with the attached charging source is available, operating communication circuitry, talk through circuitry, and ANR circuitry with power from the battery with the external charging source; if electrical power from the external battery with the attached charging source is not available, determining if electrical power from an external battery without an attached charging source is available, and if electrical power from the external battery without an attached charging source is available, operating the communication circuitry, the talk through circuitry, and the ANR circuitry with power from the battery without the external charging source; if electrical power from the external battery without an attached charging source is not available, determining if electrical power above a threshold level from an internal battery is available, and if electrical power electrical power above a threshold level from the internal battery source is available, operating the communication circuitry, the talk through circuitry, and the ANR circuitry with power from the internal battery; and if electrical power above the threshold level is not available, operating the communication circuitry and the talk through circuitry unpowered and disabling the ANR circuitry. If electrical power from the battery with the external charging source is available, the method may include operating the ANR circuitry at a first gain level and if electrical power from the battery with the external charging source is not available and electrical power from the battery without the external charging source is available, the method may include operating the ANR circuitry at a second gain level, lower than the first gain level. The determining and operating operations may be performed regardless of the position of a battery on/off switch. The operating the ANR circuitry with power from the battery without the external charging source may include operating the ANR circuitry at a first gain level and the operating the ANR circuitry with power from the internal battery may include operating the ANR circuitry at a second gain level, greater than the first gain level. The battery without the external charging source may provide electrical power at a first voltage and the internal battery may provide electrical power at a second voltage, lower than the first voltage.

In another aspect, a noise reducing headset includes first determining and operating circuitry for determining if electrical power from an external battery with an attached charging source is available, and if electrical power from the external battery with the attached charging source is available, and for operating the communication circuitry, the talk through circuitry, and the ANR circuitry with power from the battery with the external charging source; second determining and operating circuitry for determining, in the event that electrical power from the external battery with the attached charging source is not available, if electrical power from an external battery without an attached charging source is available, and if electrical power from the external battery without an attached charging source is available, and for operating the communication circuitry, the talk through circuitry, and the ANR circuitry with power from the battery without the external charging source; third determining and operating circuitry for determining, in the event that electrical power from the external battery without an attached charging source is not available, if electrical power above a threshold level from the internal battery source is available, and if electrical power electrical power above a threshold level from the internal battery source is available, and for operating the communication circuitry, the talk through circuitry, and the ANR circuitry with power from the battery with the internal battery; and circuitry for operating, in the event that electrical power above the threshold level is not available, the communication circuitry and the talk through circuitry unpowered and for disabling the ANR circuitry. The first determining and operating circuitry may include circuitry for operating the ANR circuitry at a first gain level; and the second determining and operating circuitry may include circuitry for operating the ANR circuitry at a second gain level, lower than the first gain level. The circuitry for operating the ANR circuitry with power from the external battery without the external charging source may include operating the ANR circuitry at a first gain level; and the circuitry for operating the ANR circuitry with power from the internal battery may include operating the ANR circuitry at a second gain level, greater than the first gain level. The external battery without the attached charging source may provide power at a first voltage, and the internal battery may provide power at a second voltage, lower than the first voltage. The noise reducing headset may include a boom microphone and the headset may include circuitry for indicating whether the boom microphone requires a bias voltage.

In another aspect, a power management system for a noise reducing headset includes external receiving circuitry for receiving power from one of a plurality of external power sources; internal receiving circuitry for receiving power form an internal battery; electing circuitry for exclusively electing to receive electrical power from one of the circuitry for receiving power form the external power source or the internal battery; and gain controlling circuitry, responsive to the electing circuitry for controlling a gain of active noise reduction circuitry. The gain controlling circuitry may cause the gain to be higher if the electing circuitry elects to receive power from the internal battery than if the electing circuitry elects to receive power from the external source. The external receiving circuitry may include determining circuitry for determining whether the external power source includes a battery charger and the gain controlling circuitry may cause the gain to be higher if the external source includes a battery charger than if the external source does not include a battery charger. The external receiving circuitry may include a voltage regulator for modifying the voltage to one level if the external power source includes the battery charger and to a different level if the external power source does not include a battery charger and the gain controlling circuitry may include a first comparator for comparing the output voltage of the voltage regulator with a predefined value. The external receiving circuitry may include a second comparator and a third comparator for comparing the voltage of the power from the one of the plurality of external power sources with predefined voltage values. The circuitry for receiving the power from the plurality of external power sources may include a first comparator and a second comparator for determining the voltage received from the one of the plurality of outside power sources and the circuitry for controlling the gain of the active noise reduction circuitry may include a logic element, responsive to the outputs of the first and second comparators. One of the first and second comparators may be an inverse comparator. The logic gate may be a NAND gate. The power external receiving circuitry may include a first comparator and a second comparator for comparing the voltage of the power from the one external power source with predefined values. The circuitry for receiving power may include an inverter, coupled to one of the first comparator or the second comparator Other features, objects, and advantages will become apparent from the following detailed description, when read in connection with the following drawing, in which:

DETAILED DESCRIPTION

Figure 1:
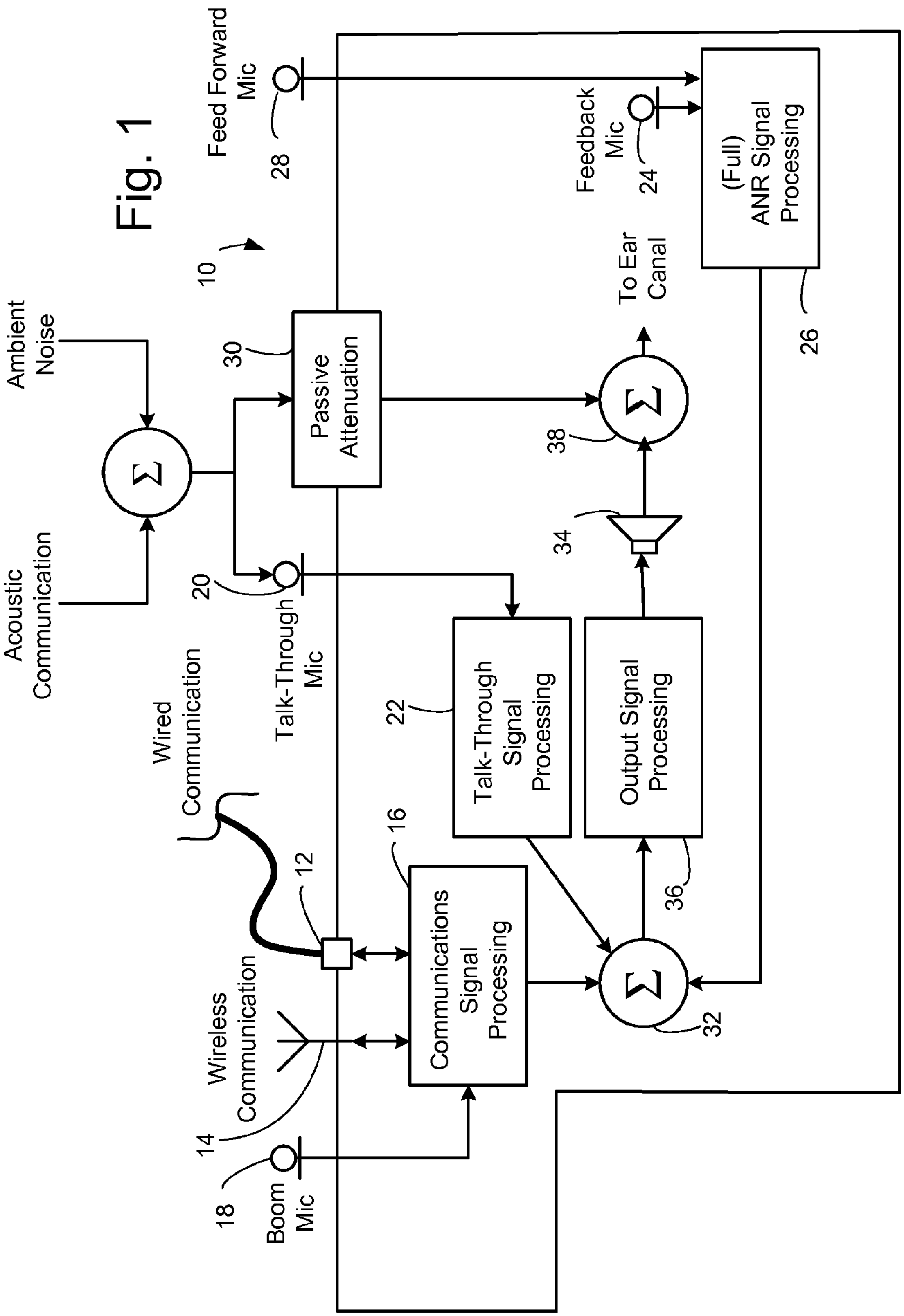
FIG. 1 is a block diagram of a noise reducing headset.

Though the elements of several views of the drawing may be shown and described as discrete elements in a block diagram and may be referred to as "circuitry", unless otherwise indicated, the elements may be implemented as one of, or a combination of, analog circuitry, digital circuitry, or one or more microprocessors executing software instructions. The software instructions may include digital signal processing (DSP) instructions. Operations may be performed by analog circuitry or by a microprocessor executing software that performs the mathematical or logical equivalent to the analog operation. Unless otherwise indicated, signal lines may be implemented as discrete analog or digital signal lines, as a single discrete digital signal line with appropriate signal processing to process separate streams of audio signals, or as elements of a wireless communication system. Some of the processes may be described in block diagrams. The activities that are performed in each block may be performed by one element or by a plurality of elements, and may be separated in time. The elements that perform the activities of a block may be physically separated. Unless otherwise indicated, audio signals may be encoded and transmitted in either digital or analog form; conventional digital-to-analog or analog-to-digital converters may be omitted from the figures. Some of the figures may include logic elements such as decision blocks, comparators, or logic gates. The output of logic elements will be designated as "0" (which corresponds to "NO" or "Low" or "open circuit") or "1" (which corresponds to "YES" or "High" or "closed circuit").

FIG. 1 is a block diagram of an earcup of a noise reduction headset 10. FIG. 1 shows functional relationship, not physical appearance. In some headsets, physical implementations of some of the blocks may not be in the earcup. The headset 10 includes portals (for example, terminal 12) for audio signals communicated by physical cables and may also include a wireless receiver/transmitter 14 for audio signals communicated wirelessly. Terminal 12 and wireless receiver/transmitter 14 are operationally coupled to communications signal processing block 16, as is a boom microphone 18. The headset may also have a talk-through microphone 20, operationally coupled to talk-through signal processing block 22. The headset may also include active noise reduction (ANR) processing elements, including an ANR feedback microphone 24, acoustically coupled to the ear canal of the user and an ANR signal processing block 26 and a feed forward microphone 28. The headset may further include passive attenuation elements, represented by passive attenuation block 30, and may also include a signal combiner 32, operationally coupled to signal processing blocks 16, 22, and 26. The signal combiner 32 is operationally coupled to acoustic driver 34 by output signal processing block 36. The acoustic driver 34 is acoustically coupled to the ear canal through acoustic combiner 38.

In operation, audio signals enter the headset 10 through terminal 12 and wireless receiver 14 and are processed by communications signal processing block 16. Additionally, sounds uttered by the user may be transduced to audio signals by boom microphone 18, and may be processed by communications signal processing block and transmitted out through terminal 12 or wireless receiver/transmitter 14 or may be processed and mixed with incoming communications signals. Processing applied by the communications signal processing block 16 may include equalizing, amplifying, attenuating, time or phase shifting or both, filtering and buffering. Acoustic communications are transduced to audio signals by talk-through microphone 28, and the audio signals are processed by talk-through processing block 22, which could include equalizing, amplifying, time or phase shifting or both, filtering and processing to remove unwanted noise from the audio signals. ANR feedback microphone 24 transduces sound in or near the ear canal of a user to audio signals which are processed by ANR signal processing block 26 to provide a noise cancelling signal. Output signals from signal processing blocks 16, 22, and 26 are combined at signal combiner 32 (which can include selecting one or more of the talk-through, ANR, or communications signals and excluding other audio signals). The output of the signal combiner 32 may be processed by output signal processor 36. Processing applied by the output signal processing block 16 may include equalizing to correct for the frequency response of the acoustic driver 34, amplifying, and the like. The output of output signal processor 36 is transduced to acoustic energy by acoustic driver 34. The acoustic energy radiated by acoustic driver 23 combines (as represented by acoustic combiner 38) with ambient noise that has been attenuated by passive noise reduction block 30 and has entered the earcup of the headset and the combined radiation enters the ear canal. Feedback microphone 24 transduces the acoustic energy at the ear canal to audio signals, which is processed by ANR signal processor 26 to provide audio signals which cancel ambient noise. The ANR signal processor 26 may also include feed forward ANR circuitry which is responsive to input from feed forward microphone 28 to supplement the feedback ANR.

The individual elements of FIG. 1 may be conventional. ANR signal processing circuitry 26 may be feedback circuitry, for example, as described in U.S. Pat. No. 4,494,074 and may be supplemented by feed forward noise reduction circuitry, for example, as described in U.S. Pat. No. 8,184,822.

Signal processing blocks 16, 22, 26 and 36 require electrical power to operate fully. The available power sources for one implementation of the headset 10 are described in FIG. 2. According to FIG. 2, power may be provided internally or externally. Internally provided power can be from an internal storage battery 40. Externally provided power can be from a storage battery 42 of an external electrically coupled device 44 not coupled to a charging device or a rechargeable battery 46 with a charging source 48 in an electrically coupled device. Typically, the internal storage battery 40 provides a voltage of, for example up to 3.0 VDC. The storage battery 40 may be coupled to other elements by a battery on/off switch 51 which can be switched off so that the battery is not drained while the headset is not in use. A storage battery 42 of an electrically coupled device 44 may provide higher voltage, for example 5 VDC, but the capacity may be shared between the electrically coupled device and the headset and other devices, so the power provided to the headset may be limited so that providing power to the headset and other devices does not deplete the charge of the storage battery 42 of the attached device more quickly than is desirable. Such a power source will be referred to as a "limited" external power source. A rechargeable storage battery 46 with a charging source 48, for example a battery that is charged by an alternator or generator powered by the vehicle engine, can maintain sufficient charge so that, relative to the electrical power needs of the headset, the power is substantially unlimited, and all functions of the headset can be operating at full capacity without depleting the battery. Such a power source will be referred to as an "unlimited" external power source. Because the internal storage battery provides power to the headset only, and not to any other device, it may provide sufficient power such that all functions of the headset can be operating at full capacity until the internal battery is depleted.

The headset 10 includes signal processing power management and distribution logic 52 to select a power source and to manage and distribute the power to the signal processing blocks 16, 22, 26, and 36 (and, if required, wireless receiver/transmitter 14). The power distributed to the signal processing blocks may not be sufficient to operate all signal processing blocks at full capacity, as will be described below.

The power management and distribution system of the headset may limit or eliminate operations of signal processing blocks 16, 22, 26 and 36 to avoid depleting power sources too rapidly. Of these processing blocks, ANR processing circuitry typically consumes the most power.

In one method for operating power management and distribution logic 52, the input voltage is determined. If the input voltage is above a first predefined level, the headset may operate with full functionality. If the input voltage is below the first predefined level but a above a second predefined level, the headset may operate with reduced functionality, and so on. If the input voltage is below a predefined lowest level, the headset may operate passively.

Other methods for operating power management and distribution logic 52 may use methods other than detecting input voltage to determine or infer the existence of and/or the characteristics of external sources of power. For example, some connectors may be configured to mate only with devices that provide unlimited external power sources or may determine or infer the existence of and/or the characteristics of external sources of power mechanically. Additionally, more sophisticated power management techniques may configure functionality based on whether the source of power is limited or unlimited instead of, or in addition to, the available voltage, as described below.

Figure 3:
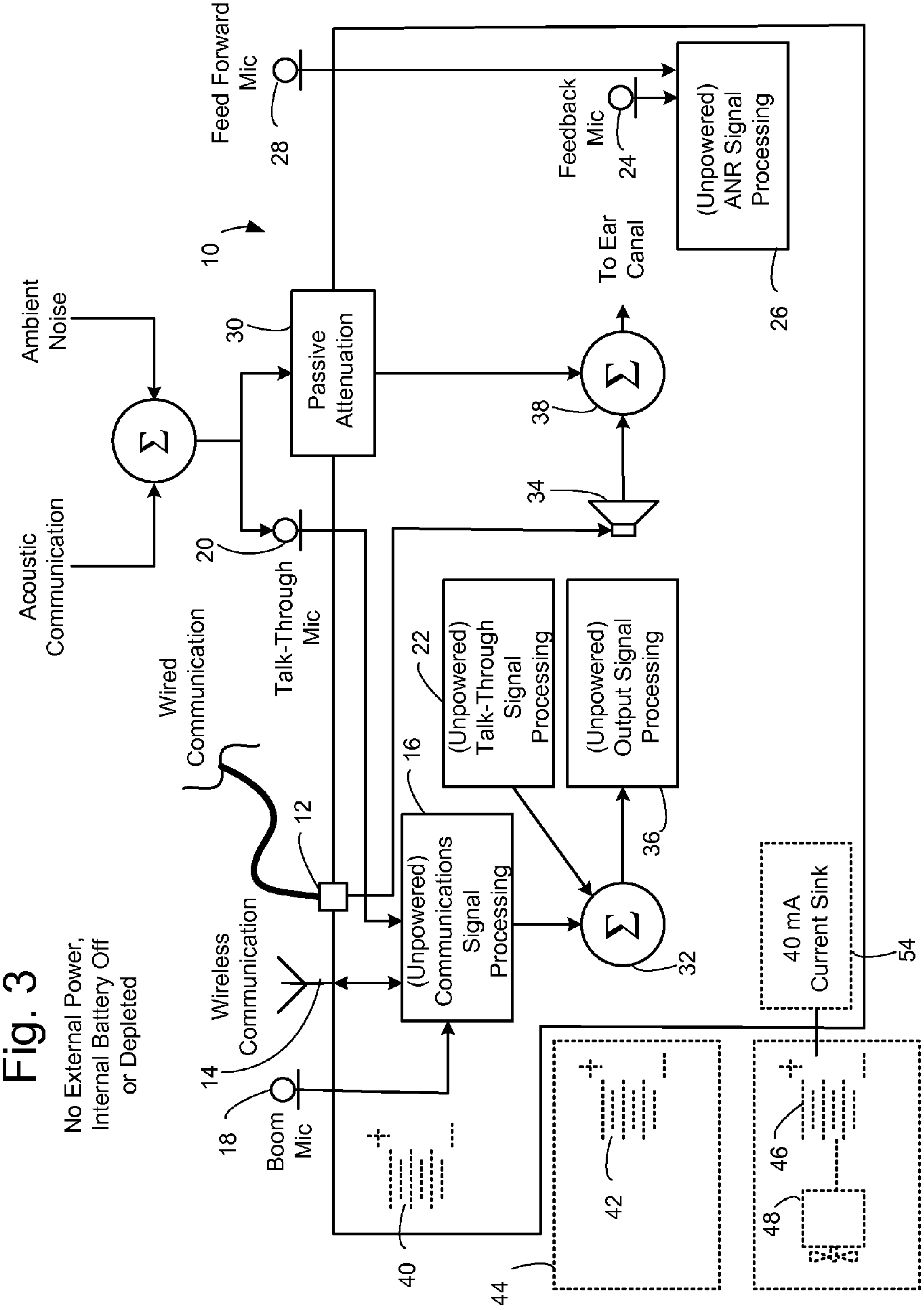
FIGS. 3-7 are block diagrams of the noise reducing headset of FIG. 1 in various power source conditions.

FIG. 3 illustrates the operation of the headset when the headset is not electrically coupled to a device having a storage battery or to a device having a rechargeable battery and a charging source and if the internal battery is absent or depleted (for example a nominal 3 VDC battery or combination of batteries provides less than 1.8 VDC) or if switch 51 (or a headset on/off switch) in the "off" position. In the configuration of FIG. 3, the ANR signal processing block is not powered or is disabled or both, and produces no noise canceling output signal. Communications signal processing block 16, talk-through signal processing block 22, and output signal processing block 26 are unpowered or disabled, or both. Audio signals that may be received from the cable terminal may be transmitted to the acoustic driver 34 unprocessed by communication signal processing block 16 or the output signal processing block 36 by being rerouted around the communication signal processing block 16 and the output signal processing block 36 directly to the acoustic driver 34 as shown, or by transmitted through the unpowered communication signal processing block 16 and the output signal processing block 36 so that the communication signals are not actively equalized, amplified, or processed in any other way by the communications signal processing block 16 or the output signal processing block 36. In one configuration, the user would hear unamplified unequalized transduced communications signals and passively attenuated ambient noise and acoustically transmitted communications. Because the communications signals are not equalized, the transduced signals may have an undesirable frequency response and may sound unnatural. Also because the communications signals are not amplified, and because the ANR signal processing 26 is not operational, the transduced communications signals may be difficult to hear in loud environments. In implementations in which the acoustically transmitted communications result in audio signals from the talk-through microphone 20 are too weak to be amplified to an audible level the acoustically transmitted communications are passively attenuated, the acoustically transmitted communications may be difficult to hear. The 40 mA current sink 54 is unused in this configuration and will be explained below.

Figure 4:
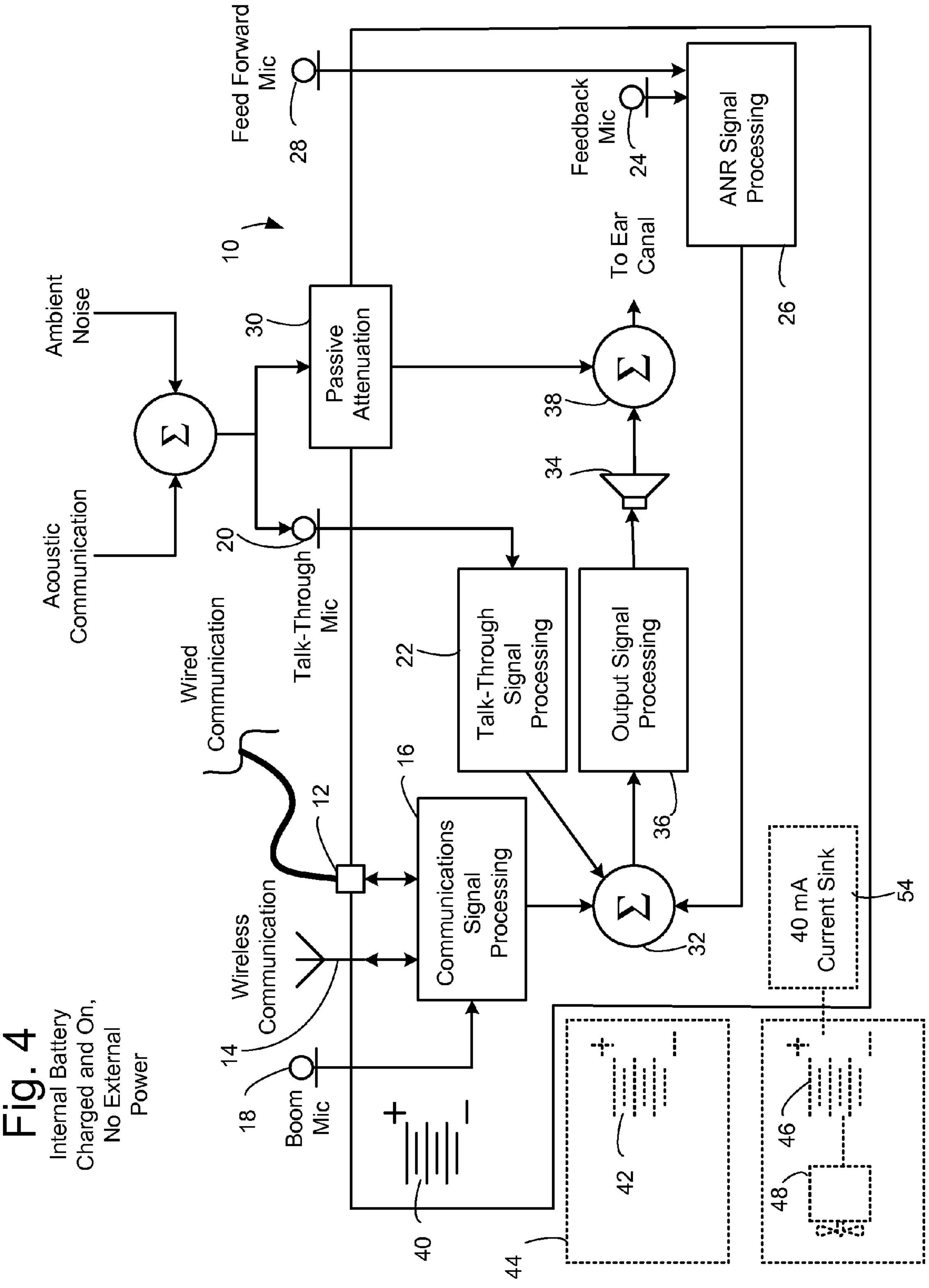

FIG. 4 illustrates the operation of the headset with internal batteries that are not depleted (for example a nominal 3 VDC battery or combination of batteries that provides 1.8 VDC or more), and with an "on/off" or "battery on/off" switch in the "on" position, and no external power is available. In the configuration of FIG. 4, the ANR signal processing block 26 is powered sufficiently to provide full ANR capability. The talk through signal processing block 22 and the communications signal processing block 16 may be fully powered. In this configuration, the user would hear amplified and equalized transduced communications and talk-through signals. Because the transduced communications and talk-through signals are equalized, they would sound more natural than with the condition of FIG. 3. Because the transduced communications and talk-through signals may be amplified, and because the ANR signal processing block 26 is operating at full capability, the transduced communications signals and the transduced talk-through signals are more distinct than in the configuration of FIG. 3 and are discernable in moderately loud environments. For example, the talk-through capability may be sufficient that a user can hear conversational level speech without removing the headset.

Figure 5:
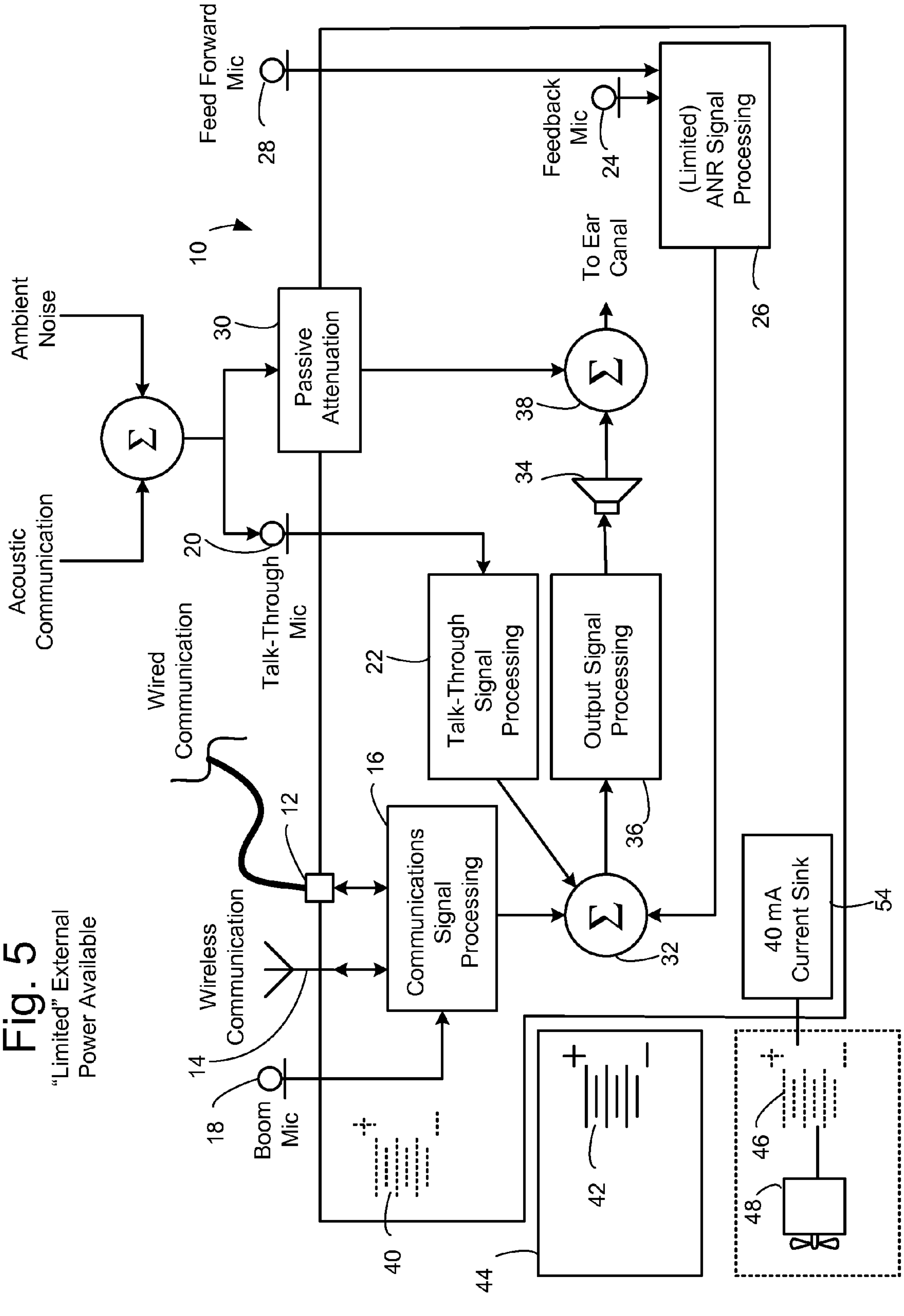

FIG. 5 illustrates the operation of the headset with a limited (as defined herein) external power source, such as an attached portable radio powered by a storage battery not attached to a recharging source. The talk through signal processing block 22 and the communications signal processing block 16 may be fully powered. In this configuration, the user would hear amplified and equalized transduced communications and talk-through signals. Because the transduced communications and talk-through signals are equalized, they would sound more natural than with the configuration of FIG. 3. Because the transduced communications and talk-through signals are amplified, and because the ANR signal processing block 26 is at least partially enabled the transduced communications signals and the transduced talk-through signals are more distinct than in the configuration of FIG. 3 and are discernable in moderately loud environments. For example, the talk-through capability may be sufficient that a user can hear conversational level speech without removing the headset. Power provided by portable radios to external devices may be limited, so that the operation of the headset may be modified so that the headset does not deplete the radio battery more quickly than is desirable. For example, the ANR may be operated at a reduced gain. The configuration of FIG. 5 illustrates a condition in which, with a higher range of voltages available than in the configuration of FIG. 4, the headset has less functionality. In practice, this is generally not detrimental, because military headsets are not often powered by limited external voltage sources in very noisy environments. Typically, when the military headset is used in a very noisy environment, such as the cabin of an operating military vehicle, an unlimited external power source, such as an intercom system is available.

Figure 6:
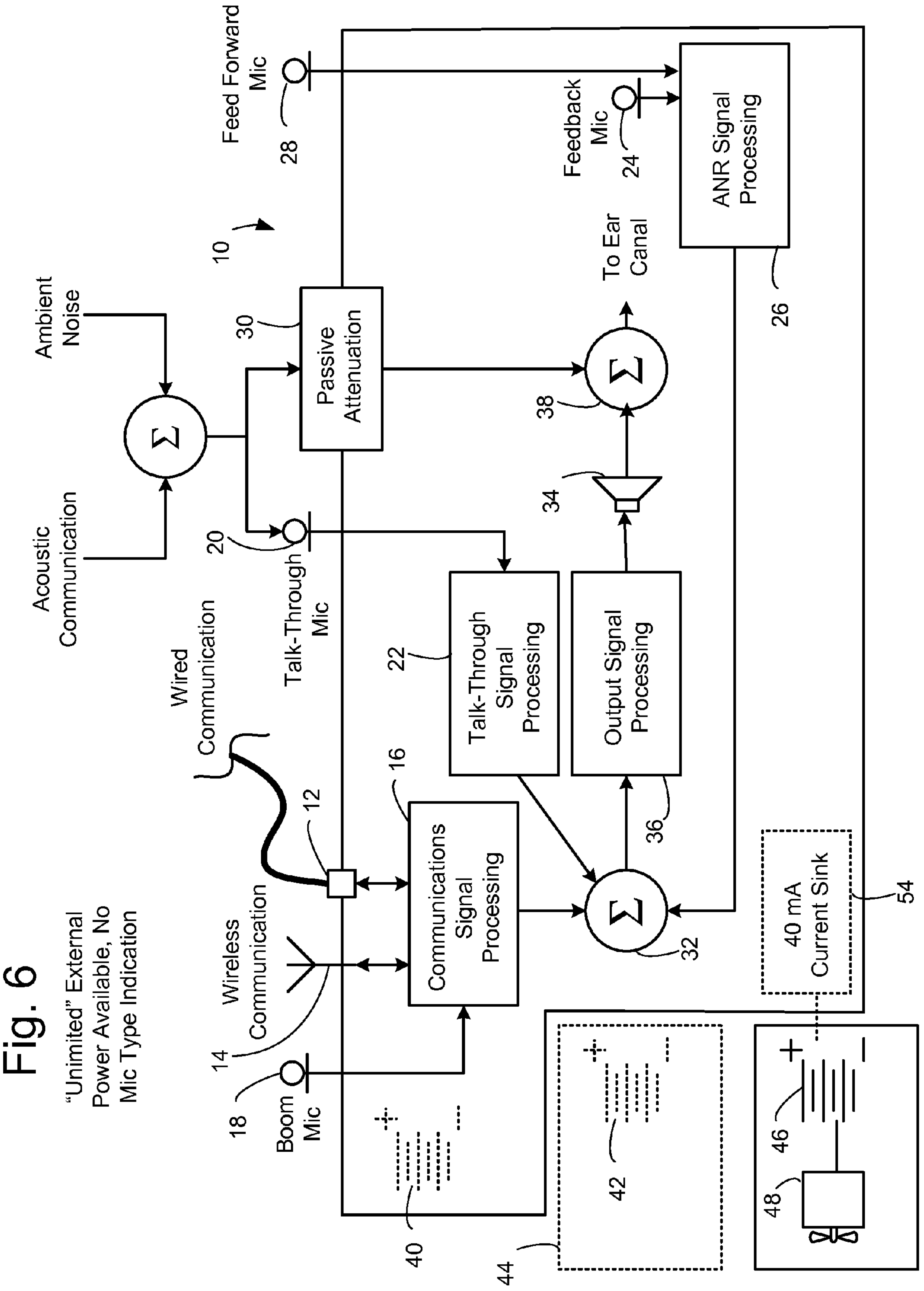

FIG. 6 illustrates the operation of the headset with an unlimited external power source that is not configured to operate with both electret and dynamic microphones, such some vehicle intercom systems powered by a rechargeable battery attached to a recharging source such as a vehicle engine alternator or generator. The talk through signal processing block 22 and the communications signal processing block 16 are fully powered. In this configuration, the user would hear amplified and equalized transduced communications and talk-through signals. Because the transduced communications and talk-through signals are equalized, they would sound more natural than with the configuration of FIG. 3. Because the transduced communications and talk-through signals are amplified, and because the ANR signal processing block 26 is fully enabled the transduced communications signals and the transduced talk-through signals are more distinct than in previous configurations are discernable in very loud environments, for example inside a military vehicle with the engine running. In the condition of FIG. 6, the 40 mA current sink is not operational.

Figure 7:
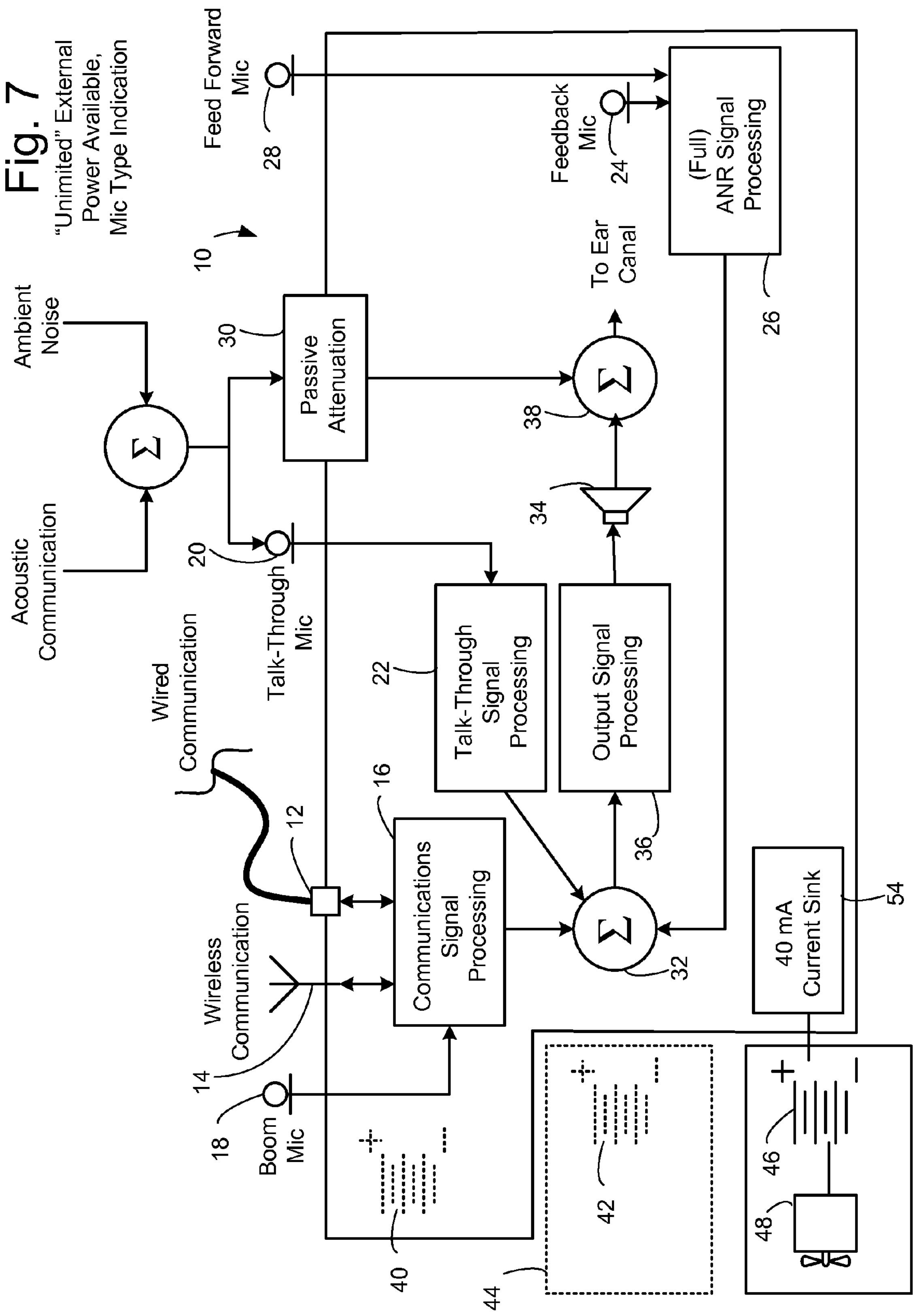

FIG. 7 illustrates the operation of the headset with an unlimited external power source configured to operate with either electret or dynamic microphones, such as a VIC type intercom system. The operation of the configuration of FIG. 7 is similar to the operation of the configuration of FIG. 6, except the headset may have a current sink 54 so that the headset pulls a current that is a constantly 40 mA or greater to indicate to the intercom system that the boom microphone is an electret type microphone. Some intercom systems are designed to operate with both electret and dynamic microphone signals. Electret microphone signals typically require a current limited bias voltage to be applied to the microphone signal terminal, while dynamic microphone signals do not require a bias voltage. If the headset consumes less than 40 mA (except for potential occasional spikes), the intercom will configure itself to operate with an audio signal level associated with a 150 ohm dynamic microphone. In this instance, the intercom applies a +24 dB gain to the boom microphone signal path. If the headset consumes 40 mA or more, the intercom configures itself to operate with an audio signal level associated with an electret microphone. In this instance, the intercom bypasses the +24 dB gain. In addition to ensuring that the incoming signal from the intercom is at an appropriate level, this feature facilitates the operation of the headset when the headset is not electrically coupled to a device having a storage battery or to a device having a rechargeable battery and a charging source and if the internal battery is absent or depleted. In this condition, the current sink and the ANR circuitry are inactive, so the intercom detects headset consumption of less than 40 mA and applies the +24 dB gain.

Battery on/off switch 51 is not shown in FIGS. 3-7 because the state of battery on/off switch 51 is relevant only if it is in the off position and no power from external sources is available, as in the configuration of FIG. 3. If power from an external source is available, the power from the external source is used and power from the internal battery is not used, regardless of the state of the battery on/off switch, as will be discussed below.

Figure 2:
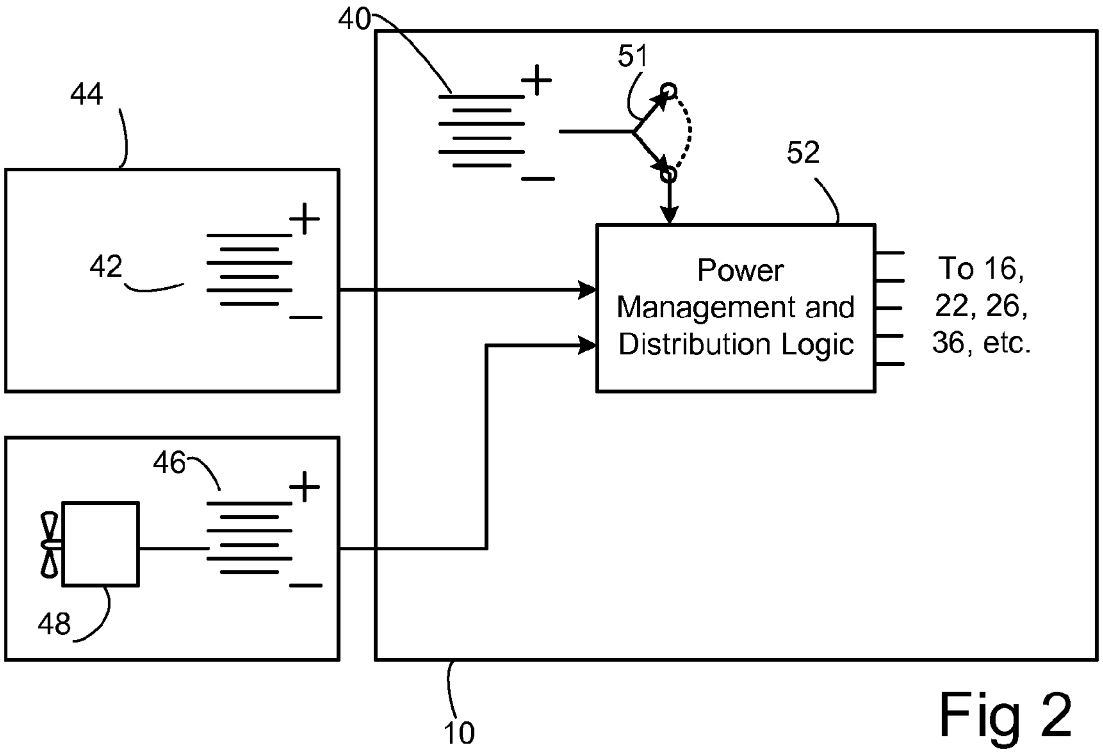
FIG. 2 is a block diagram of an element of the noise reducing headset of FIG. 1 with some associated power sources.
Figure 8:
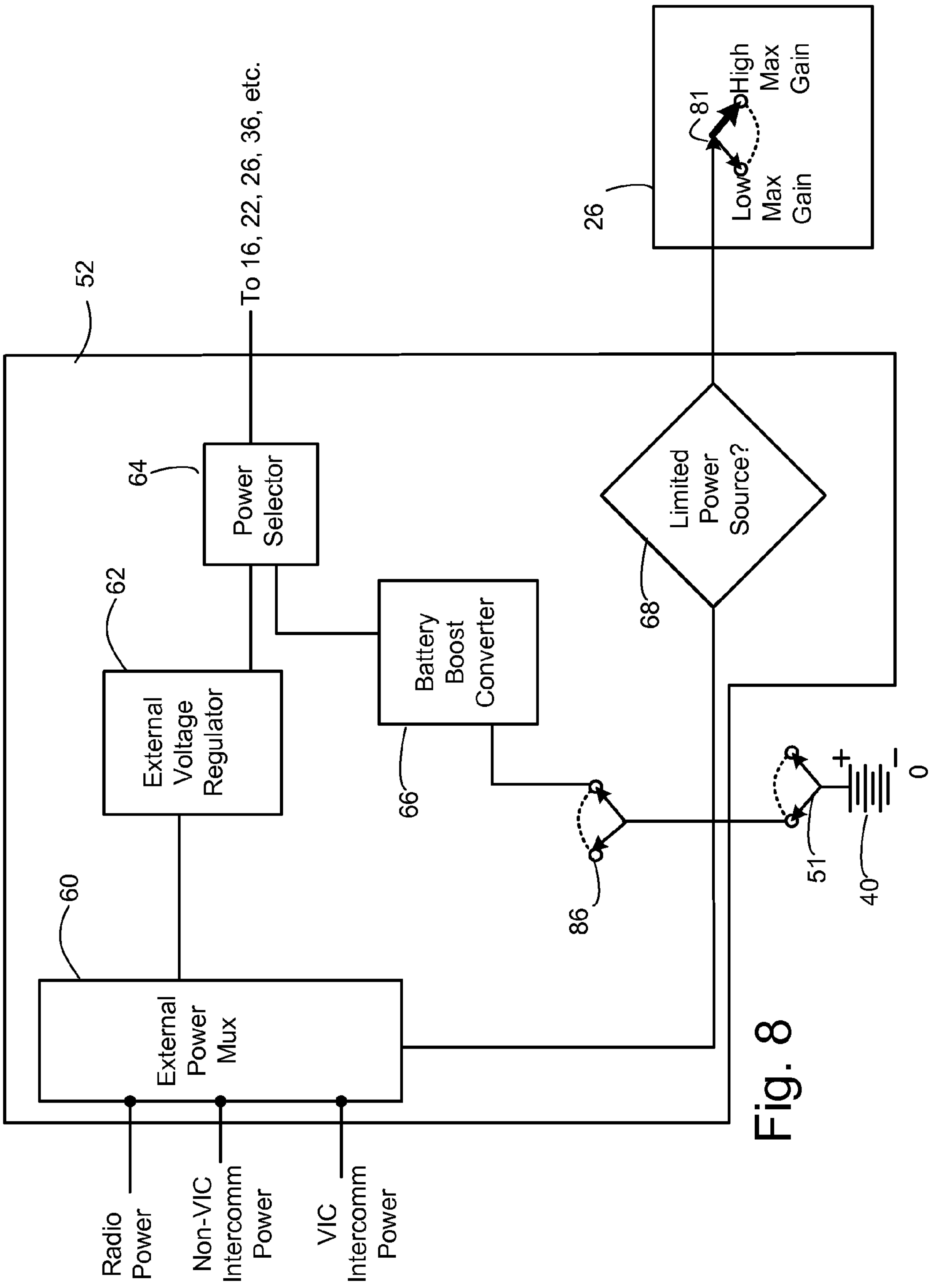
FIG. 8 is a block diagram of an element of FIG. 1.

FIG. 8 shows an example of power distribution and management logic 52 of FIG. 2. Power distribution and management logic 52 includes an external power multiplexer 60 coupled to an external voltage regulator 62 both logically and for transmitting power as will be discussed in more detail below. The external voltage regulation 62 is coupled to a power selector 64. The power distribution and management logic 52 further includes a battery boost converter 66 and a switch 86 coupling internal battery 40 and switch 51 to the power selector 64. The external power multiplexer 60 is logically coupled to power source determination block 68, which controls a switch 81 in the ANR signal processing block 26 as will be described in more detail below. Switch 86 and is in an ON state if the output of voltage of switch 51 is 1.8 VDC or greater and in an OFF state if the output of voltage switch 51 is less than 1.8 VDC, that is, if the battery 40 is depleted, switch 51 is in the OFF position, or both. Switch 81 will be discussed below.

In operation, external power multiplexer 60 receives electrical power from external devices that may be electrically coupled to the headset. If more than one source of electrical power is coupled to the headset, the external power multiplexer selects the highest voltage external source. External voltage regulator 62 receives the electrical power from the external power multiplexer 60 and converts the electrical power to a voltage, for example 3.4-3.5 V, usable by signal processing blocks 16, 22, 26, and 36 of previous views. If the external voltage regulator 62 is turned OFF, the external voltage regulator output 0 volts. Battery boost converter converts electrical power from internal battery 40 to a voltage, for example 3.5 V, usable by the signal processing blocks 16, 22, 26, and 36 of previous views. If the battery boost converter 66 is turned OFF, it outputs 0 volts. Power selector 64 is electrically coupled to receive electrical power from the battery boost converter 66 and the external voltage regulator 62. As will be described below, at least one of the battery boost converter 66 or the external voltage regulator outputs no power to the power selector 64, so effectively, the power selector acts to output, to signal processing blocks 16, 22, 26, and 36 (of previous views), power from only one of the battery boost converter 66 or the external voltage regulator 62 or, if both the battery boost converter 66 and the external voltage regulator 62 both output zero power, the power selector 64 outputs no power. The power source determination block 68 determines the power source and if the power source is a limited external power source (as defined above) and if the power source is a limited external power source, adjusts the operation of the processing block, in this example adjusting the maximum gain of the ANR signal processing block 26.

Instead of, or supplementing, the external multiplexer may be circuitry for selecting the external power source mechanically. As stated above, some connectors may determine or infer the existence of and/or the characteristics of external sources of power mechanically, and may select the voltage source based on the inferred characteristics. For example, if the headset has a terminal that is connectable only to unlimited external power sources, and the headset detects a connector connected to that terminal, the headset may select the input from the unlimited power source.

FIGS. 9A-9E illustrate one form 68A of power source determination block 68 of FIG. 8 and its operation in several conditions. Power source determination block 68A includes comparator 72 which controls the 40 milliamp current sink 54; comparator 74, which controls a TRIM operator of the external voltage regulator 62; comparator 76, which controls external voltage regulator 62, and which controls battery boost converter 66 through inverter 78; and comparator 80 which is responsive to the output voltage of the power selector 64 and which controls a switch 82. In subsequent figures, thick lines indicated logic flow, while other lines indicate flow of electrical power.

Figure 9A:
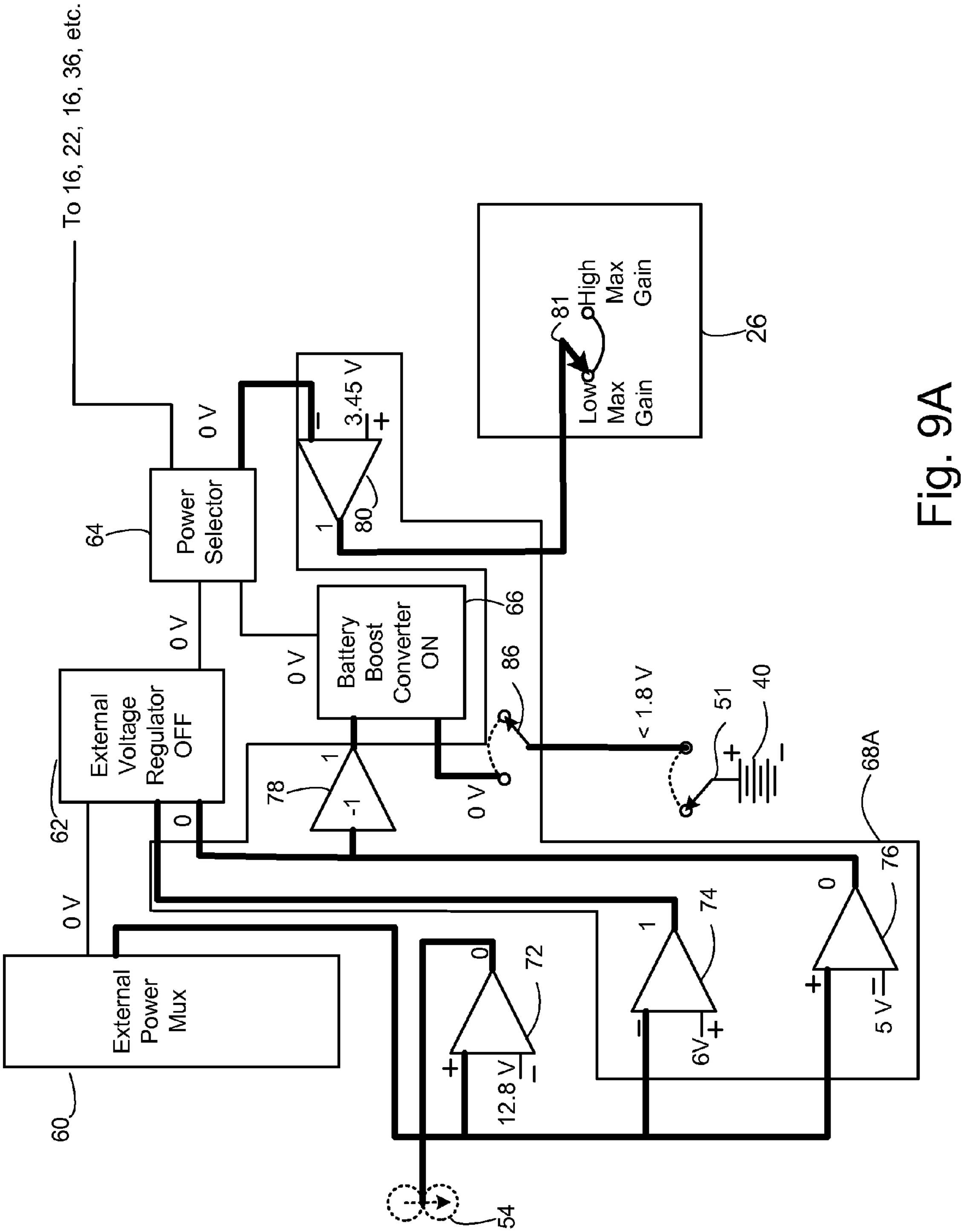
FIGS. 9A-9E are block diagrams of elements of the noise reducing headset of FIG. 1, in various power source conditions.

FIG. 9A illustrates the operation of one implementation 68A of the power source determination block 68 of FIG. 8 when there are no external power sources connected to the headset and the internal battery 40 is depleted or the switch 51 is in the OFF position as shown, regardless of the state of the charge of internal battery 40. Comparator 72 determines if the output voltage of the external power multiplexer 60 is 12.8 volts or greater; in this example, comparator 72 outputs "0", which causes 40 milliamp current sink 54 to be non-activated, as discussed above in the discussion of FIG. 7. Comparator 76 determines if the output voltage of the external power multiplexer 60 is 5 V or greater; in this example, comparator 76 outputs "0", which causes external voltage regulator 62 to turn or remain OFF and which causes inverter 78 to output "1", which causes battery boost converter 66 to become or remain enabled. Due to the arrangement of comparator 76 and inverter 78, only one of the battery boost converter and the external voltage regulator can be in and ON state. Comparator 74 determines if the output of the external voltage regulator is less than 6 volts; in this example comparator 74 outputs "1" which activates the TRIM operator of external voltage regulator 62. However, in the condition of FIG. 9A, the TRIM function is not relevant, because the external voltage regulator 62 is OFF. The output of switch 51 is less than 1.8 V, which causes switch 86 to be in the OFF position.

In this condition, external voltage regulator 62 is OFF, so it outputs 0 V; battery boost converter has an input of 0 V, so its output is 0 V; and the inputs to power selector 64 are both 0 V, so its output is 0 V, and the signal processing blocks 16, 22, 26, and 36 are unpowered. Comparator 80 determines if the output of the power selector 64 is less than 3.45 V; in this example, the output of comparator 80 is "0", which causes switch 81 to be in the LOW MAX GAIN position. However the maximum gain of the ANR signal processing block is not relevant because the ANR circuit is unpowered.

The discussion of FIG. 9A assumes the logic elements, such as the comparators to be operative (for example if they are powered by some other source than the internal battery. In an actual implantation, the logic elements may be unpowered and therefor inoperative. In this instance the signal processing blocks are bypassed, as shown in FIG. 3.

Figure 9B:
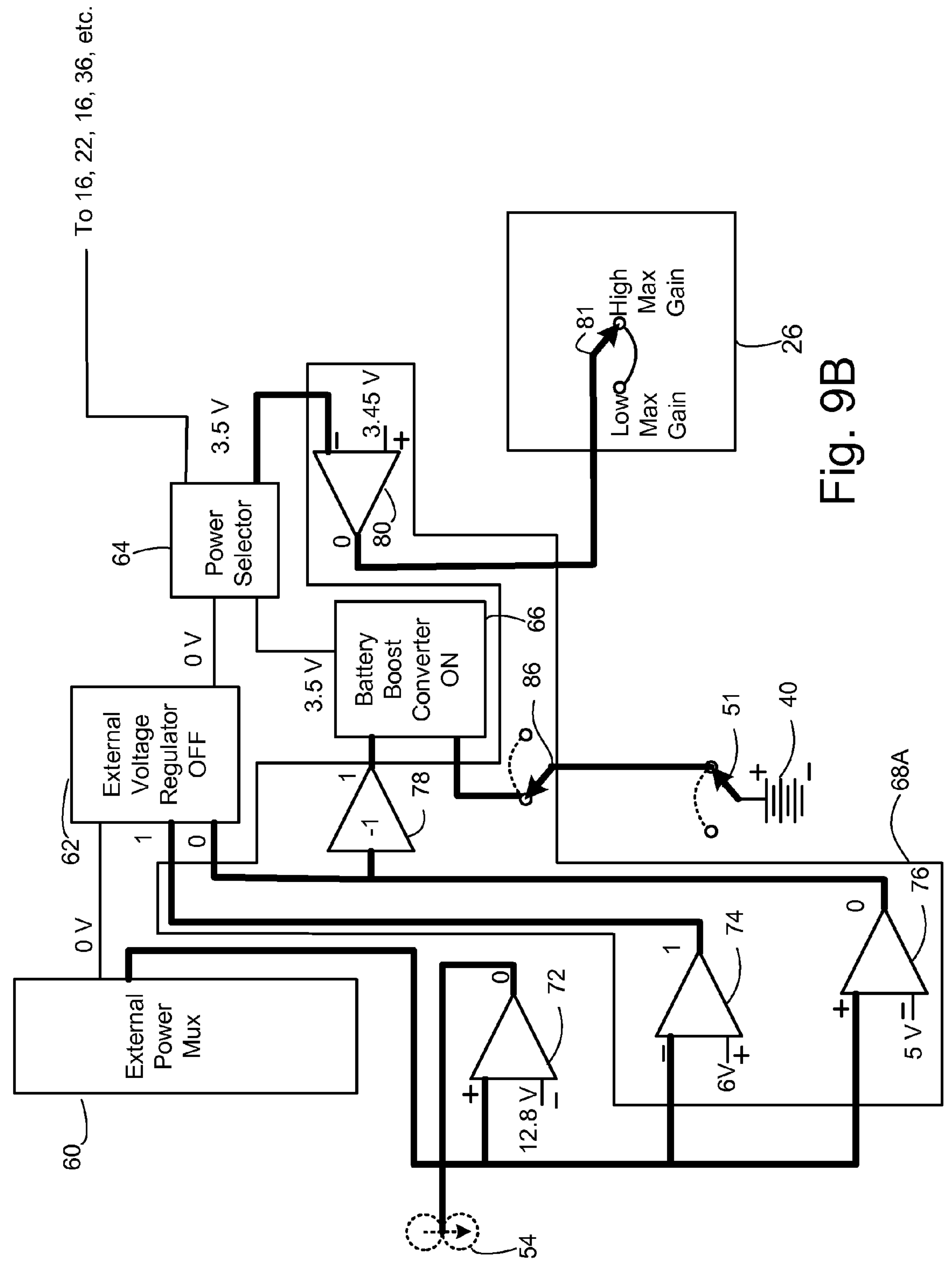

FIG. 9B illustrates the operation of the power source determination block 68A when the headset is not coupled to an external power source, battery switch 51 is ON, and the battery 40 is sufficiently charged to provide 1.8-3.0 V. Comparator 72 outputs "0", which causes 40 milliamp current sink 54 to be non-activated, as discussed above in the discussion of FIG. 7. Comparator 76 outputs "0", which causes external voltage regulator 62 to turn or remain OFF and which causes inverter 78 to output "1", which causes battery boost converter 66 to turn or remain ON. Comparator 74 outputs "1" which activates the TRIM operator of external voltage regulator 62.

In this condition, external voltage regulator 62 is OFF, so it outputs 0 V; battery boost converter converts the input voltage to 3.5 V and outputs 3.5 V to the power selector 64. Power selector 64 outputs 3.5 V to signal processing blocks 16, 22, 26, and 36. Comparator 80 outputs "0", which causes switch 81 to be in the HIGH MAX GAIN position, which will be discussed below.

Figure 9C:
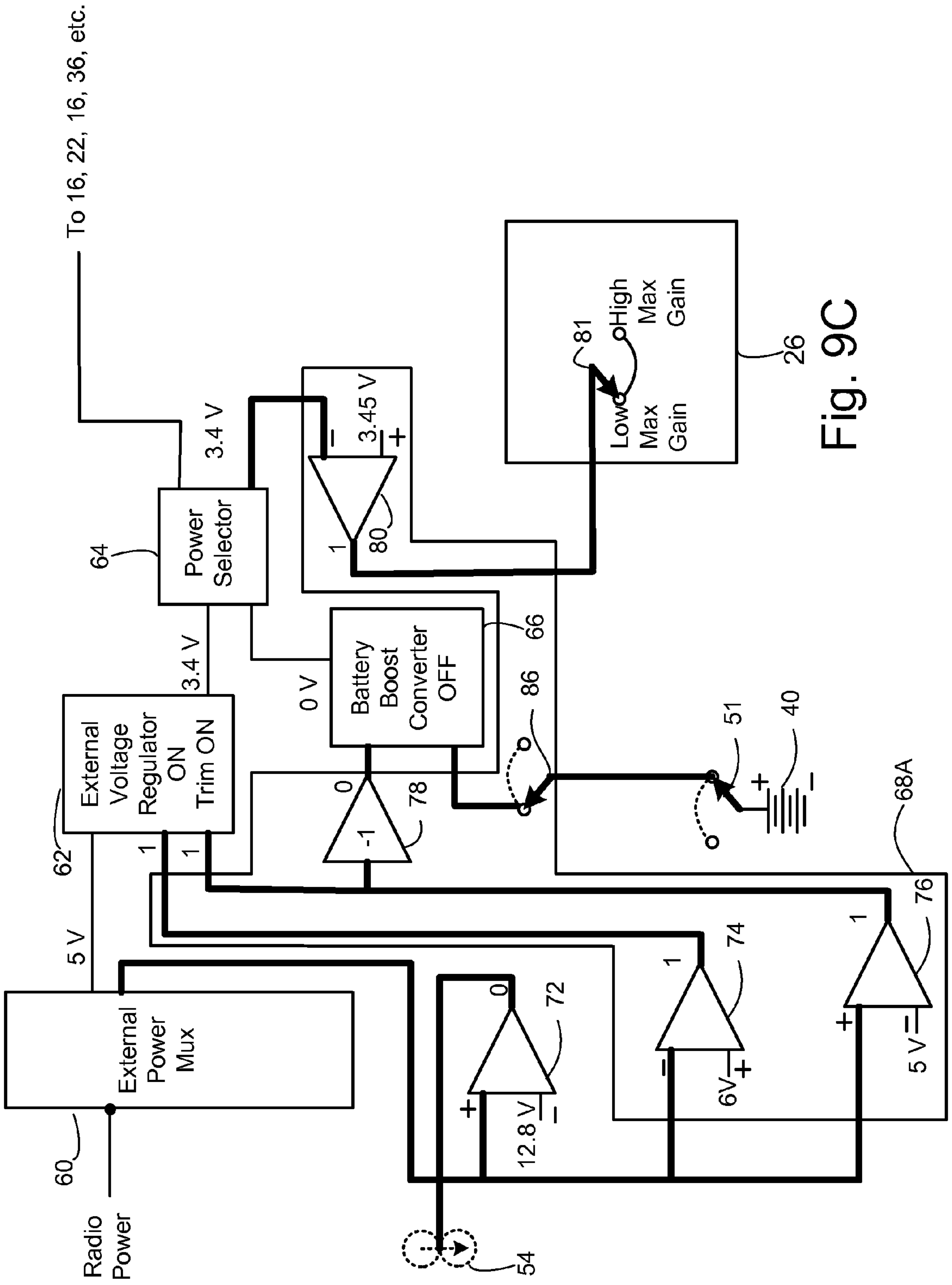

FIG. 9C illustrates the operation of the power source determination block 68A when the headset is coupled to a limited external power source, as defined above. An example is a portable radio that provides 5 V power to external devices such as a headset. Comparator 72 outputs "0", which causes 40 milliamp current sink 54 to be non-activated, as discussed above in the discussion of FIG. 7. Comparator 76 outputs "1", which causes external voltage regulator 62 to turn or remain ON and which causes inverter 78 to output "0", which causes battery boost converter 66 to turn or remain OFF. Comparator 74 outputs "1" so the TRIM operator of the external voltage regulator 62 is activated. Switch 86 may be in either the ON or OFF position.

In this condition, external voltage regulator 62 is ON and the TRIM operator is ON, so it converts the input voltage from 5 to 3.5 V, trims the voltage a lower voltage that is sufficient to power circuits 16, 22, 16, and 36, for example 3.45 V and outputs the lower voltage to the power selector 64. Battery boost converter is OFF, so it outputs 0 V to the power selector 64. Power multiplexer outputs 3.4 V to signal processing blocks 16, 22, 26, and 36. Comparator 80 outputs "1", which causes switch 81 to be in the LOW MAX GAIN position, which will be discussed below.

The example of FIG. 9C illustrates a feature of the circuit of FIGS. 8 and 9A-9E. The circuit adjusts the operation of the signal processing based on the unique capabilities and requirements of the components. It does not merely add, enhance, limit, or delete signal processing operations based on input voltage. For example, in the configuration of FIG. 9B, the ANR signal processing is fully enabled, but in FIG. 9C, the ANR signal processing is limited, despite the higher available voltage.

Figure 9D:
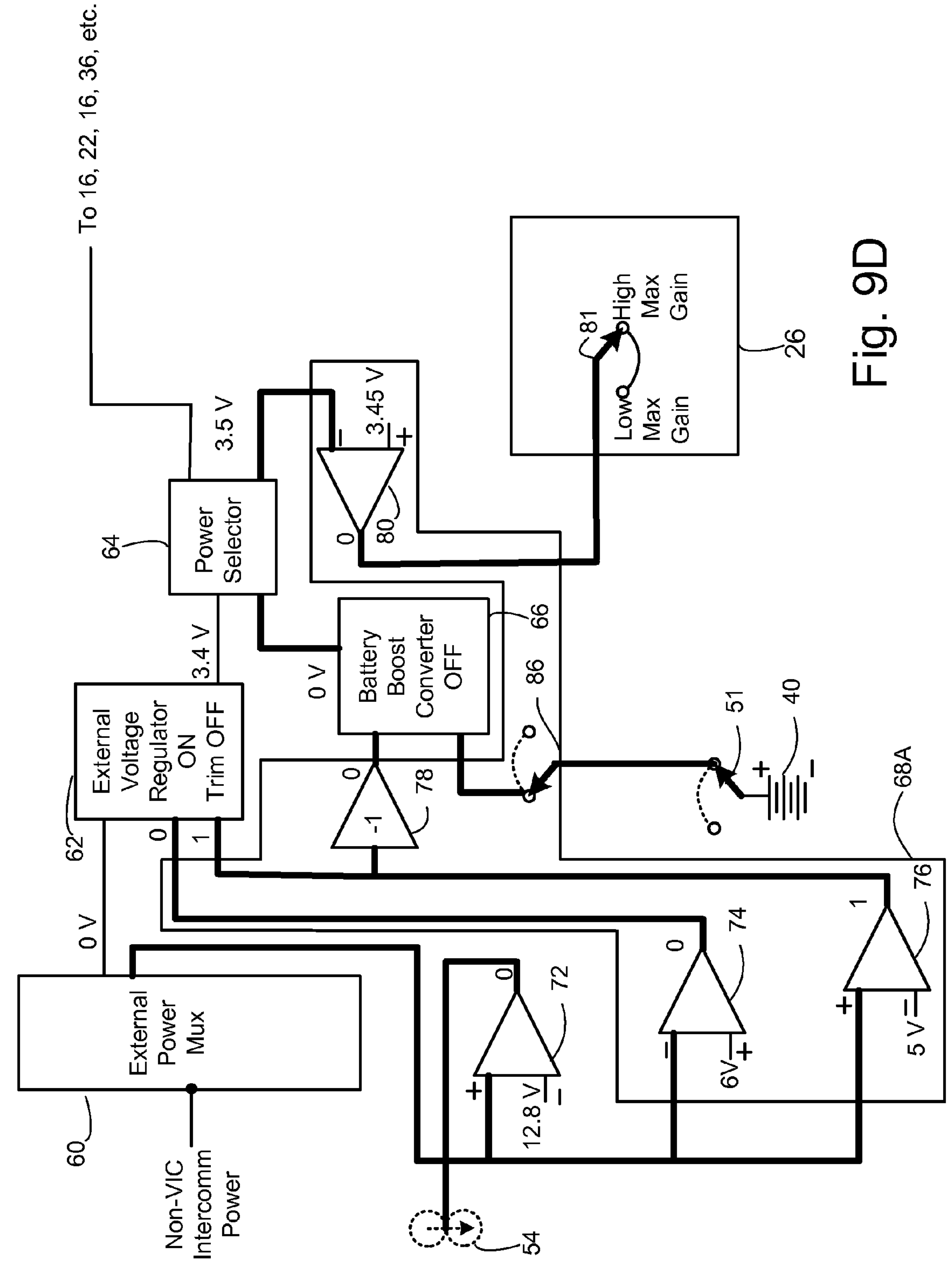

FIG. 9D illustrates the operation of the power source determination block 68A when the headset is coupled to an unlimited external power source (as defined above) similar to the unlimited power source of FIG. 6 for example an intercom system not configured to operate with both electret and dynamic microphones. Comparator 72 outputs “0”, which causes 40 milliamp current sink 54 to be non-activated, as discussed above in the discussion of FIG. 7. Comparator 76 outputs “1”, which causes external voltage regulator 62 to turn or remain ON and which causes inverter 78 to output “0”, which causes battery boost converter 66 to turn or remain OFF. Comparator 74 outputs “0” so the TRIM operator of the external voltage regulator 62 is not activated Switch 86 may be in either the ON or OFF position.

In this condition, external voltage regulator 62 is ON and the TRIM operator is OFF, so the external voltage regulator 62 converts the input voltage from 5 to 3.5 V and outputs 3.5 V to the power selector 64. Battery boost converter is OFF, so it outputs 0 V to the power selector 64. Power multiplexer outputs 3.5 V to signal processing blocks 16, 22, 26, and 36. Comparator 80 outputs “0”, which causes switch 81 to be in the HIGH MAX GAIN position.

Figure 9E:
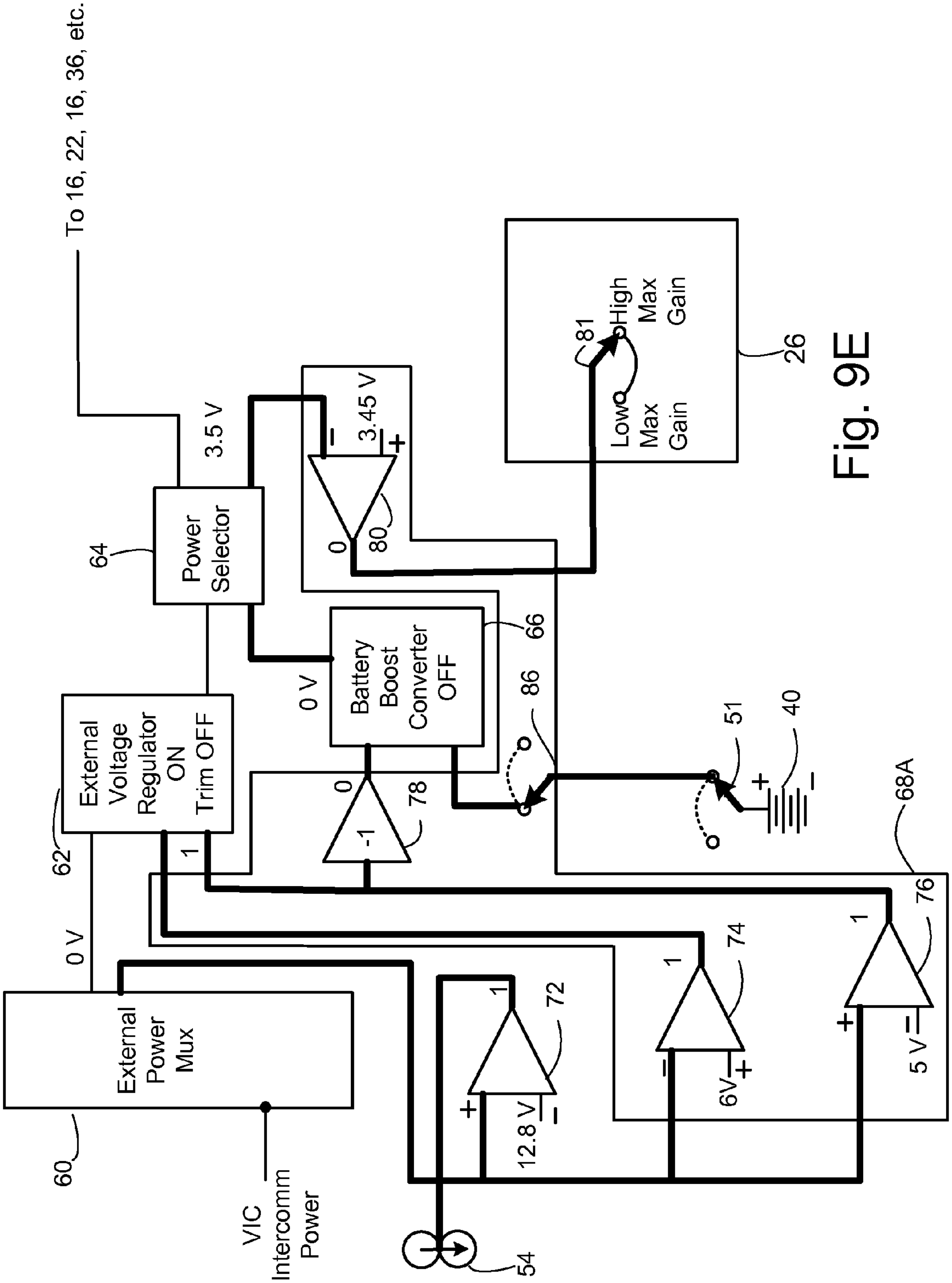

FIG. 9E illustrates the operation of the power source determination block 68A when the headset is coupled to an unlimited external power source (as defined above) associated with a device which is configured to operate with different types of boom microphones as described above in the discussion of FIG. 7. Comparator 72 outputs “1”, which causes 40 milliamp current sink 54 to be activated, as discussed above in the discussion of FIG. 7. Comparator 76 outputs “1”, which causes external voltage regulator 62 to turn or remain ON and which causes inverter 78 to output “0”, which causes battery boost converter 66 to turn or remain OFF. Comparator 74 outputs “0” so the TRIM operator of the external voltage regulator 62 is not activated Switch 86 to is in either the ON or OFF position.

In this condition, external voltage regulator 62 is ON and the TRIM operator is OFF, so the external voltage regulator 62 converts the input voltage from 5 to 3.5 V and outputs 3.5 V. Battery boost converter is OFF, so it outputs 0 V to the power selector 64. Power multiplexer outputs 3.5 V to signal processing blocks 16, 22, 26, and 36. Comparator 80 outputs “1”, which causes switch 81 to be in the HIGH MAX GAIN position.

FIGS. 10A-10E illustrate a second form 68B of power source determination block 68 and its operation in the same conditions as FIGS. 9A-9E. Power source determination block 68B includes comparator 72 which controls the 40 milliamp current sink 54; comparator 74, which provides an input to NAND gate 92, controls external voltage regulator 62, and controls battery boost converter 66 through inverter 78; and comparator 76, which provides a second input to NAND gate 92.

Figure 10A:
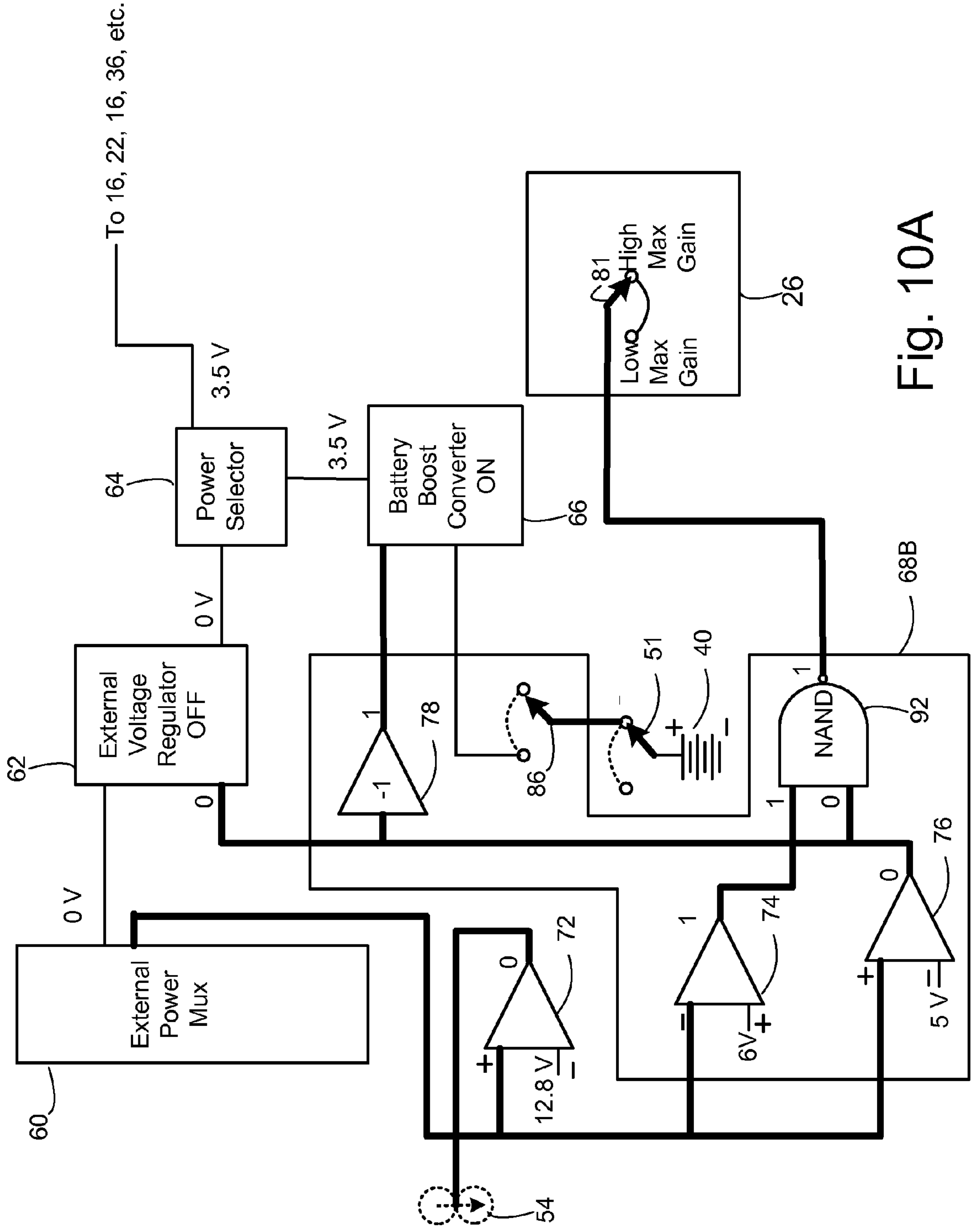
FIGS. 10A-10E are block diagrams of elements of the noise reducing headset of FIG. 1, in various power source conditions.

FIG. 10A illustrates the operation of a second implementation 68B of the power source determination block 68 of FIG. 8 when there are no external power sources connected to the headset and the internal battery 40 is depleted (for example, outputs less than 1.8 VDC) or the switch 51 is in the OFF position as shown, regardless of the state of the charge. Comparator 72 determines if the output voltage of the external power multiplexer 60 is 12.8 volts or greater; in this example, comparator 72 outputs “0”, which causes 40 milliamp current sink 54 to be non-activated, as discussed above in the discussion of FIG. 7. Comparator 76 determines if the output voltage of the external power multiplexer 60 is 5 V or greater; in this example, comparator 76 outputs “0” to NAND gate 92, to external voltage regulator 62 which causes external voltage regulator 62 to turn or remain OFF, and to inverter 78, which causes inverter 78 to output “1”, which causes battery boost converter 66 to turn or remain ON. Comparator 74 determines if the output of the external voltage regulator is less than 6 volts; in this example comparator 74 outputs “1” to NAND gate 92. Switch 86 is in the OFF position.

In this condition, external voltage regulator 62 is OFF, so it outputs 0 V; battery boost converter has an input of 0 V, so its output is 0 V; and the inputs to power selector 64 are both 0 V, so its output is 0 V, and the signal processing blocks 16, 22, 26, and 36 are unpowered. NAND gate 92 outputs “1”, which causes switch 81 to be in the HIGH MAX GAIN position. However, since the ANR signal processing circuitry is unpowered, the position of switch 81 is not relevant.

Figure 10B:
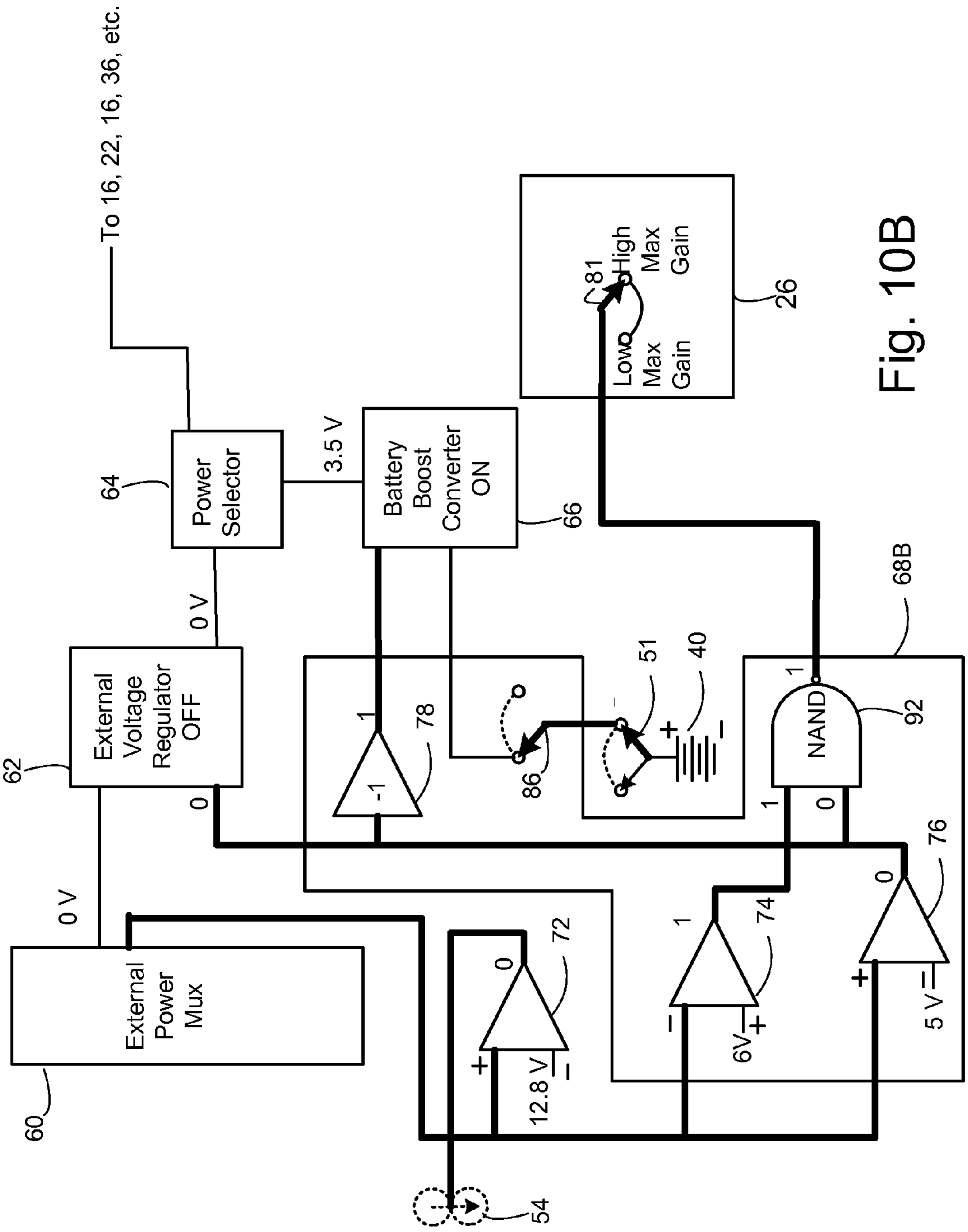

FIG. 10B illustrates the operation of the power source determination block 68B when the headset is not coupled to an external power source, battery switch 51 is ON, and the battery 40 provides 1.8-3.0 V. Comparator 72 outputs “0”, which causes 40 milliamp current sink 54 to be non-activated, as discussed above in the discussion of FIG. 7. Comparator 76 outputs “0” to NAND gate 92, and to external voltage regulator 62 which causes external voltage regulator 62 to turn or remain OFF and which causes inverter 78 to output “1”, which causes battery boost converter 66 to turn or remain ON. Comparator 74 outputs “1” to NAND gate 92. Switch 86 is in the ON position.

In this condition, external voltage regulator 62 is OFF, so it outputs 0 V; battery boost converter converts the input voltage to 3.5 V and outputs 3.5 V to the power selector 64. Power multiplexer outputs 3.5 V to signal processing blocks 16, 22, 26, and 36. NAND gate 92 outputs “1”, which causes switch 81 to be in the HIGH MAX GAIN position, which will be discussed further below.

Figure 10C:
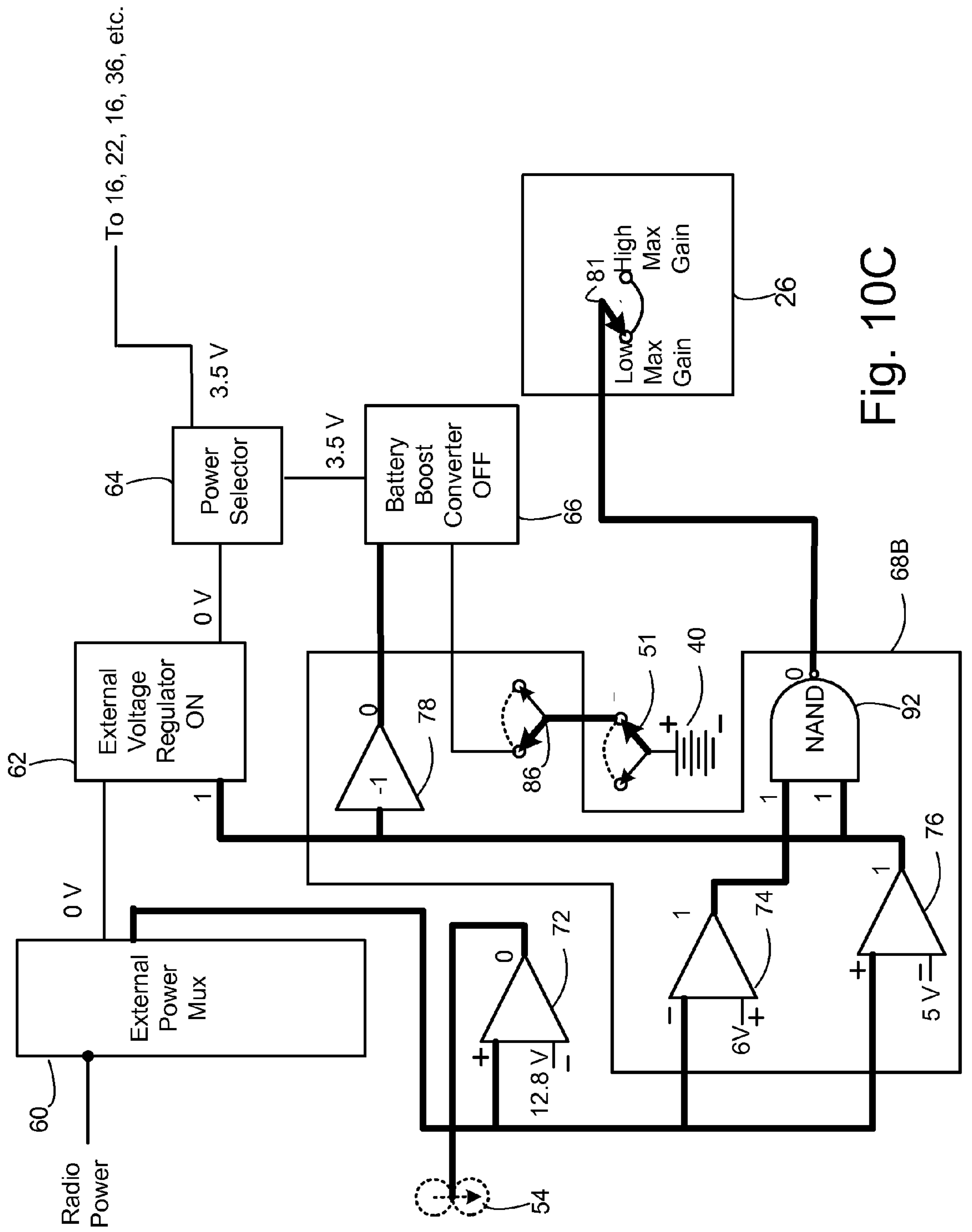

FIG. 10C illustrates the operation of the power source determination block 68A when the headset is coupled to a limited external power source, as defined above. An example is a portable radio that provides 5 V power to external devices such as a headset. Comparator 72 outputs “0”, which causes 40 milliamp current sink 54 to be non-activated, as discussed above in the discussion of FIG. 7. Comparator 76 outputs “1” to NAND gate 92, and to external voltage regulator 62 which causes external voltage regulator 62 to turn or remain ON and which causes inverter 78 to output “0”, which causes battery boost converter 66 to turn or remain OFF. Comparator 74 outputs “1” to NAND gate 92. Switch 86 may be in either the ON or OFF position.

Similar to the example of FIG. 9C, the example of FIG. 10C illustrates a feature of the circuit of FIGS. 8 and 10A-10E. The circuit adjusts the operation of the signal processing based on the unique capabilities and requirements of the components. It does not merely add, enhance, limit, or delete signal processing operations based on input voltage. For example, in the configuration of FIG. 10B, the ANR signal processing is fully enabled, but in FIG. 10C, the ANR signal processing is limited, despite the higher available voltage.

Figure 10D:
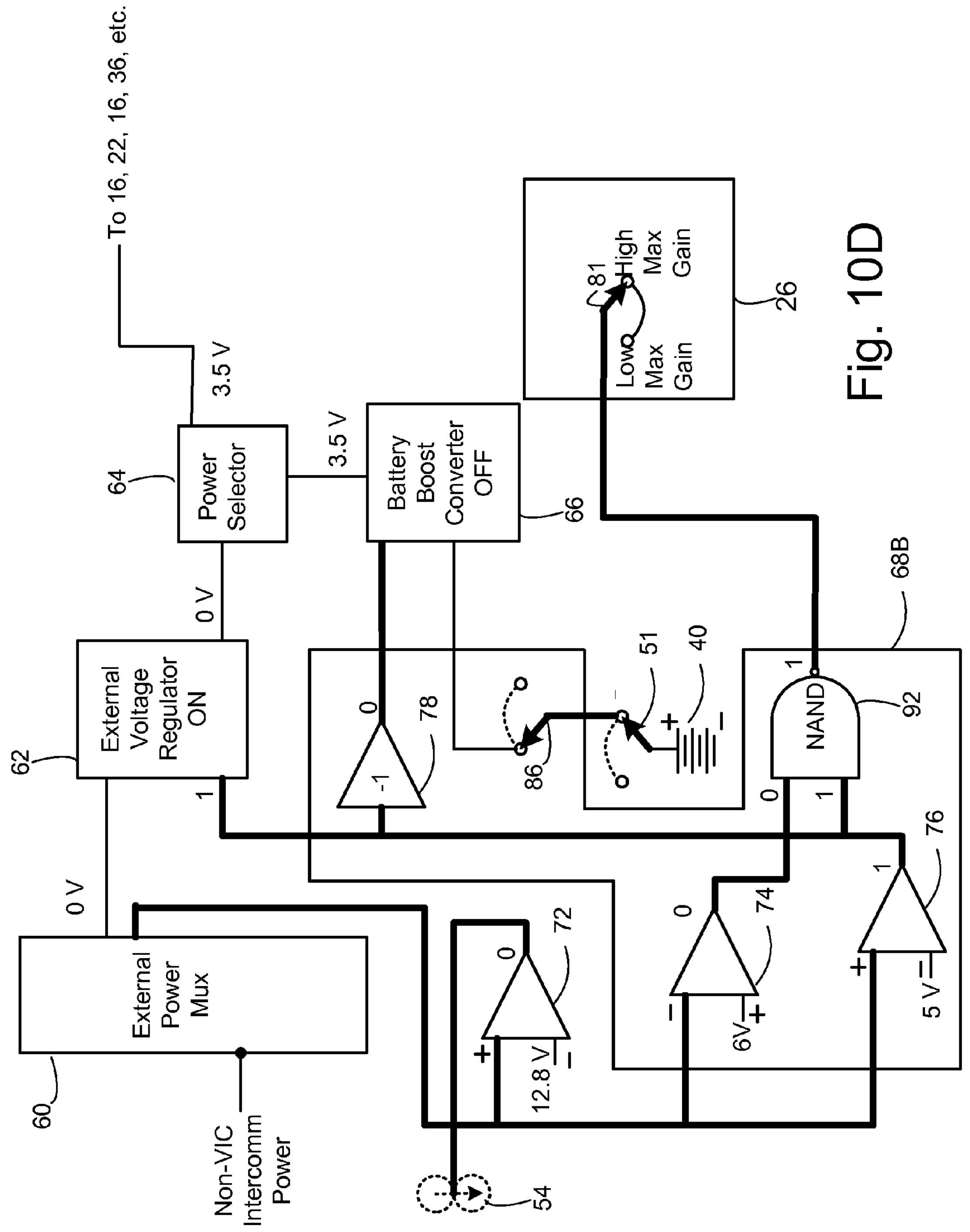

FIG. 10D illustrates the operation of the power source determination block 68A when the headset is coupled to an unlimited external power source (as defined above) of less than 12.8 VDC) similar to the unlimited power source of FIG. 6 for example an intercom system not configured to operate with both electret and dynamic microphones. Comparator 72 outputs “0”, which causes 40 milliamp current sink 54 to be non-activated, as discussed above in the discussion of FIG. 7. Comparator 76 outputs “1” to NAND gate 92 and to external voltage regulator 62, which causes external voltage regulator 62 to turn or remain ON and outputs “1” to inverter 78, which causes inverter 78 to output “0”, which causes battery boost converter 66 to turn or remain OFF. Comparator 74 outputs "0" to NAND gate 92. Switch 86 may be in either in the ON or OFF position.

In this condition, external voltage regulator 62 is ON, so the external voltage regulator 62 converts the input voltage to 3.5 V and outputs 3.5 V to power selector 64. Battery boost converter is OFF, so it outputs 0 V to the power selector 64. Power multiplexer outputs 3.5 V to signal processing blocks 16, 22, 26, and 36. NAND gate 92 outputs "0", which causes switch 81 to be in the HIGH MAX GAIN position, which will be discussed further below.

Figure 10E:
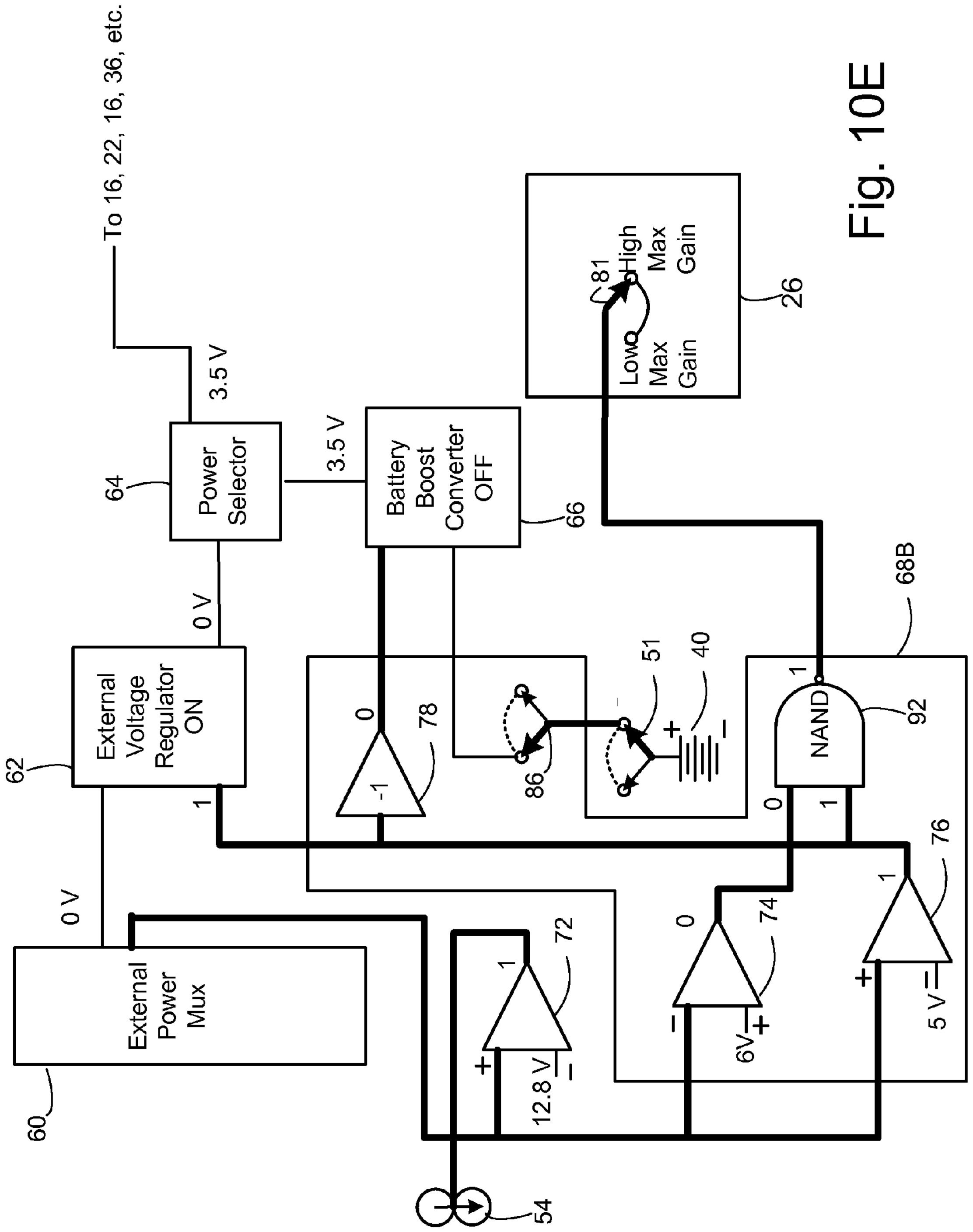

FIG. 10E illustrates the operation of the power source determination block 68A when the headset is coupled to an unlimited external power source (as defined above) of 12.8 VDC or greater, associated with a device which is configured to operate with different types of boom microphones as described above in the discussion of FIG. 7. Comparator 72 outputs "1", which causes 40 milliamp current sink 54 to be activated, as discussed above in the discussion of FIG. 7. Comparator 76 outputs "1" to NAND gate 92 and to external voltage regulator 62, which causes external voltage regulator 62 to turn or remain ON and outputs "1" to inverter 78, which causes inverter 78 to output "0", which causes battery boost converter 66 to turn or remain OFF. Comparator 74 outputs "0" to NAND gate 92. Switch 86 may be in either ON or OFF position.

In this condition, external voltage regulator 62 is ON, so the external voltage regulator 62 converts the input voltage to 3.5 V and outputs 3.5 V. Battery boost converter is OFF, so it outputs 0 V to the power selector 64. Power multiplexer outputs 3.5 V to signal processing blocks 16, 22, 26, and 36. NAND gate 92 outputs "1", which causes switch 81 to be in the HIGH MAX GAIN position, which will be discussed further below.

Figure 11:
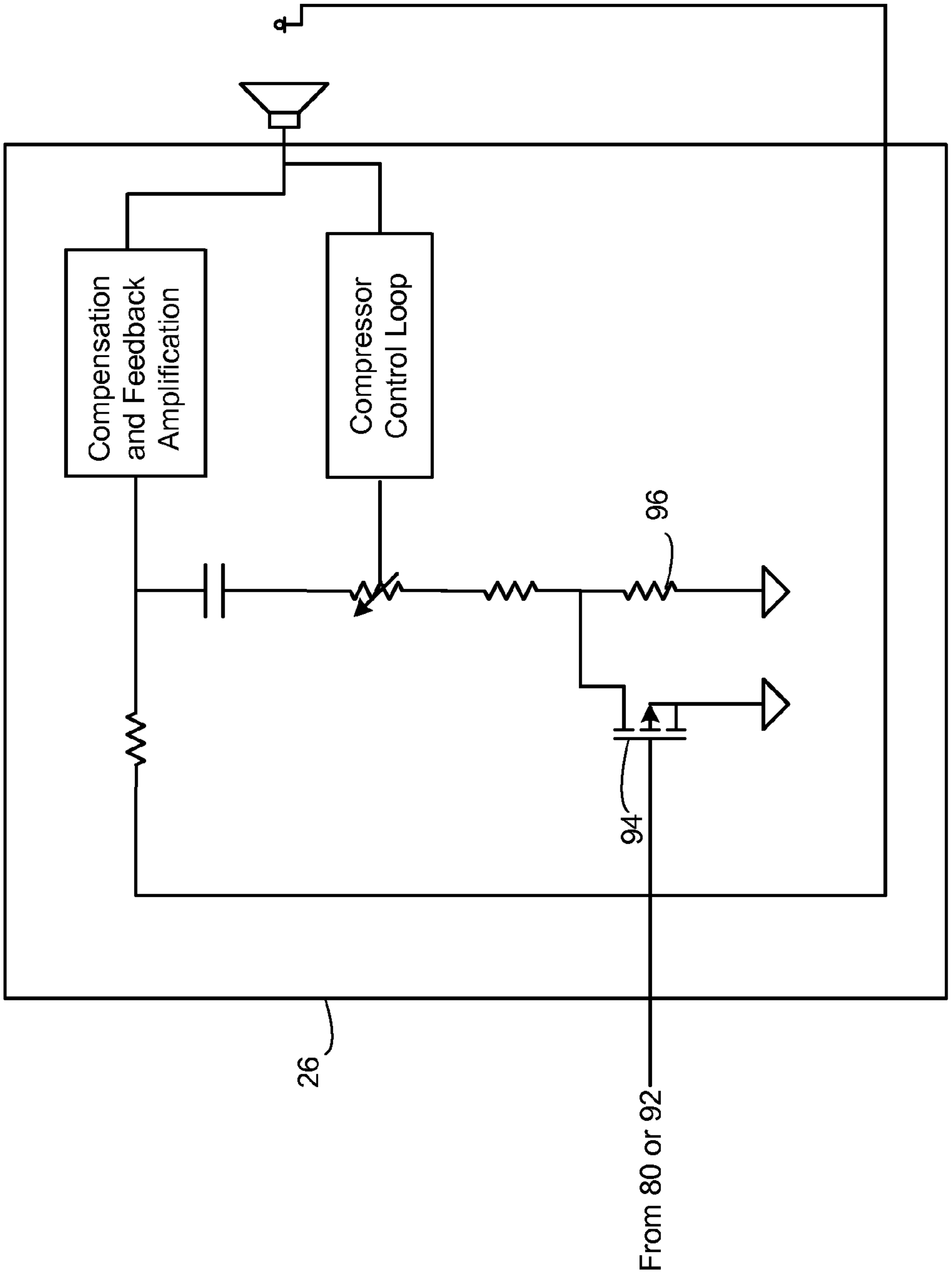
FIG. 11 is a block diagram of elements of the noise reducing headset of FIG. 1.

FIG. 11 shows an example of circuit for implementing the switch 81 of FIGS. 9A-9E and FIGS. 10A-10E. A "0" output of comparator 80 of FIGS. 9A-9E or of NAND gate 92 of FIGS. 10A-10E causes MOSFET 94 to be in the OFF state, which corresponds to the HIGH MAX GAIN condition of FIGS. 9A-9E and 10A-10E. A "1" output of comparator of FIGS. 9A-9E or of NAND gate FIGS. 10A-10E causes MOSFET 94 to be in an ON state, which shorts circuits the resistor 96, which lowers the amplitude at which the compressor reduces the maximum gain of the ANR. Reducing the maximum ANR gain permits the ANR circuit to effectively reduce low level noise and provides some attenuation of high level noise.

The headset described above is designed to work with equipment with defined specifications. If it is desirable or necessary for the headset to work with equipment with different specifications, the characteristics of the components could be modified. For example, the headset described does not provide for operations with limited external power sources that provide 3.0-5.0 VDC. If it is desired for the headset to work with such devices, the characteristics of the components could be modified, for example changing reference voltages of one or more of the comparators 72, 74, and 76.

Numerous uses of and departures from the specific apparatus and techniques disclosed herein may be made without departing from the inventive concepts. Consequently, the invention is to be construed as embracing each and every novel feature and novel combination of features disclosed herein and limited only by the spirit and scope of the appended claims.

What is claimed is:

1. A method for operating a noise reducing headset comprising:

determining if electrical power from an external battery with an attached charging source is available, and if electrical power from the external battery with the attached charging source is available, operating communication circuitry, talk through circuitry, and active noise reduction circuitry with power from the external battery with the attached charging source;

if electrical power from the external battery with the attached charging source is not available, determining if electrical power from an external battery without an attached charging source and providing a first voltage is available, and if electrical power from the external battery without an attached charging source is available, operating the communication circuitry, the talk through circuitry, and the active noise reduction circuitry with power from the battery without the external charging source, operation of the active noise reduction circuitry being at a first gain level;

if electrical power from the external battery without an attached charging source is not available, determining if electrical power above a threshold voltage, lower than the first voltage, from an internal battery is available, and if electrical power above a threshold voltage from the internal battery source is available, operating the communication circuitry, the talk through circuitry, and the active noise reduction circuitry with power from the internal battery, operation of the active noise reduction circuitry being at a second gain level greater than the first gain level; and if electrical power above the threshold voltage is not available from the internal battery, operating the communication circuitry and the talk through circuitry unpowered and disabling the active noise reduction circuitry.

2. The method for operating the noise reducing headset of claim 1, wherein if electrical power from the external battery with the attached charging source is available, operating the active noise reduction circuitry at a third gain level; and if electrical power from the external battery with the attached charging source is not available and electrical power from the external battery without the attached charging source is available, operating the active noise reduction circuitry at the first gain level, the first gain level being lower than the third gain level.

3. The method for operating the noise reducing headset of claim 1, wherein the determining and operating operations are performed regardless of the position of a battery on/off switch.

4. A noise reducing headset comprising:

first determining and operating circuitry for determining if electrical power from an external battery with an attached charging source is available, and if electrical power from the external battery with the attached charging source is available, operating the communication circuitry, the talk through circuitry, and the active noise reduction circuitry with power from the external battery with the attached charging source;

second determining and operating circuitry for determining, in the event that electrical power from the external battery with the attached charging source is not available, if electrical power from an external battery without an attached charging source and providing a first voltage is available, and if electrical power from the external battery without an attached charging source is available, operating the communication circuitry, the talk through circuitry, and the active noise reduction circuitry with power from the external battery without the attached charging source, the second determining and operating circuitry operating the active noise reduction circuitry at a first gain level;

third determining and operating circuitry for determining, in the event that electrical power from the external battery without an attached charging source is not available, if electrical power above a threshold voltage, lower than the first voltage, from the internal battery source is available, and if electrical power electrical power above a threshold voltage from the internal battery source is available, operating the communication circuitry, the talk through circuitry, and the active noise reduction circuitry with power from the battery with the internal battery, the third determining and operating circuitry operating the active noise reduction circuitry at a second gain level greater than the first gain level; and circuitry for operating, in the event that electrical power above the threshold voltage is not available from the internal battery, the communication circuitry and the talk through circuitry unpowered and for disabling the active noise reduction circuitry.

5. The noise reducing headset of claim 4, wherein the first determining and operating circuitry comprises circuitry for operating the active noise reduction circuitry at a third gain level; and the second determining and operating circuitry comprises circuitry for operating the active noise reduction circuitry at the first gain level, the first gain level being lower than the third gain level.

6. The noise reducing headset of claim 4, wherein the headset comprises a boom microphone and wherein the headset comprises circuitry for indicating whether the boom microphone requires a bias voltage.

7. A power management system for a noise reducing headset comprising:

external receiving circuitry for receiving power from one of a plurality of external power sources;

internal receiving circuitry for receiving power from an internal battery;

electing circuitry for exclusively electing to receive electrical power from one of the external receiving circuitry or the internal receiving circuitry; and gain controlling circuitry, responsive to the electing circuitry for controlling a gain of active noise reduction circuitry, wherein the external receiving circuitry comprises determining circuitry for determining whether the external power source includes a battery charger and whether the external power source provides a first voltage, the internal receiving circuitry comprises determining circuitry for determining whether the internal battery provides a second voltage, lower than the first voltage, and the gain controlling circuitry causes the gain to be higher if the electing circuitry elects to receive power from the internal receiving circuitry than if the electing circuitry elects to receive power from the external receiving circuitry when the external power source does not include the battery charger and the first voltage is greater than the second voltage.

8. The power management system of claim 7, wherein the gain controlling circuitry causes the gain to be higher if the external source includes a battery charger than if the external source does not includes a battery charger.

9. The power management system of claim 8, wherein the external receiving circuitry comprises a voltage regulator for modifying the voltage to one level if the external power source includes the battery charger and to a different level if the external power source does not include a battery charger and wherein the gain controlling circuitry comprises a first comparator for comparing the output voltage of the voltage regulator with a predefined value.

10. The power management system of claim 9, wherein the external receiving circuitry comprises a second comparator and a third comparator for comparing the voltage of the power from the one of the plurality of external power sources with predefined voltage values.

11. The power management system of claim 8, wherein the circuitry for receiving the power from the plurality of external power sources comprises a first comparator and a second comparator for determining the voltage received from the one of the plurality of outside power sources; and wherein the circuitry for controlling the gain of the active noise reduction circuitry comprises a logic element, responsive to the outputs of the first and second comparators.

12. The power management system of claim 11, wherein one of the first and second comparators is an inverse comparator.

13. The power management system of claim 12, wherein the logic gate is a NAND gate.

14. The power management system of claim 7, wherein the external receiving circuitry comprises a first comparator and a second comparator for comparing the voltage of the power from the one external power source with predefined values.

15. The power management system of claim 14, wherein the circuitry for receiving power comprises an inverter, coupled to one of the first comparator or the second comparator.

* * * * *